US011560516B2

(12) United States Patent
Hong

(10) Patent No.: US 11,560,516 B2
(45) Date of Patent: Jan. 24, 2023

(54) LIGHT EMITTING DEVICE AND PHOSPHOR

(71) Applicant: Mitsubishi Chemical Corporation, Chiyoda-ku (JP)

(72) Inventor: Byungchul Hong, Chiyoda-ku (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 459 days.

(21) Appl. No.: 16/590,604

(22) Filed: Oct. 2, 2019

(65) Prior Publication Data

US 2020/0048549 A1 Feb. 13, 2020

Related U.S. Application Data

(63) Continuation of application No. PCT/JP2018/017535, filed on May 2, 2018.

(30) Foreign Application Priority Data

May 11, 2017 (JP) .............................. JP2017-094871
Oct. 31, 2017 (JP) .............................. JP2017-210719

(51) Int. Cl.
C09K 11/77 (2006.01)
C09K 11/08 (2006.01)
C09K 11/62 (2006.01)
C09K 11/68 (2006.01)
H01L 33/50 (2010.01)

(52) U.S. Cl.
CPC ........ C09K 11/7787 (2013.01); C09K 11/685 (2013.01); C09K 11/7708 (2013.01); C09K 11/778 (2013.01); C09K 11/7764 (2013.01); C09K 11/7776 (2013.01); H01L 33/502 (2013.01)

(58) Field of Classification Search
CPC ............ C09K 11/7734; C09K 11/7774; C09K 11/7706; C09K 11/7787; C09K 11/778; C09K 11/0838; C09K 11/62; C09K 11/685; C09K 11/7708; C09K 11/7764; C09K 11/7776; H01L 33/502
See application file for complete search history.

(56) References Cited

U.S. PATENT DOCUMENTS

| | | | |
|---|---|---|---|
| 2006/0238101 A1 | 10/2006 | Choi et al. | |
| 2009/0160341 A1 | 6/2009 | Justel et al. | |
| 2011/0087440 A1 | 4/2011 | Lau et al. | |
| 2013/0119280 A1* | 5/2013 | Fuchi | C03C 8/22 250/504 R |
| 2016/0126428 A1 | 5/2016 | Hosokawa et al. | |
| 2018/0358514 A1* | 12/2018 | Tragl | A61B 1/0661 |

FOREIGN PATENT DOCUMENTS

| | | |
|---|---|---|
| JP | 2008-517092 A | 5/2008 |
| JP | 2009-533812 A | 9/2009 |
| JP | 2011-233586 A | 11/2011 |
| JP | 2013-057037 A | 3/2013 |
| JP | 2013-508809 A | 3/2013 |
| JP | 2014-189592 A | 10/2014 |
| JP | 2016-060812 A | 4/2016 |
| JP | 2016-092401 A | 5/2016 |
| WO | WO 2012/008325 A1 | 1/2012 |
| WO | WO 2016/174236 A1 | 11/2016 |

OTHER PUBLICATIONS

Machine translation of JP2014189592A, 32 pages. (Year: 2014).*
Office Action dated Jan. 11, 2022 issued in corresponding Japanese Patent Application No. 2019-517595 (with English machine translation).
Notification of Transmittal of Translation of the International Preliminary Report on Patentability dated Nov. 21, 2019, in PCT/JP2018/017535, 13 pages.
Combined Taiwanese Office Action and Search Report dated Oct. 4, 2021 in corresponding Taiwanese Patent Application No. 107115960 (with English Translation), 11 pages.
International Search Report dated Jul. 31, 2018 in PCT/JP2018/017535 filed May 2, 2018.
Nie, Z, et al., Spectroscopic investigation of $CaAl_{12}O_{19}:M^{3+}$ upon UV/vacuum-UV excitation: a comparison with $SrAl_{12}O_{19}:M^{3+}$ (M=Pr, Cr), Journal of Physics : Condensed Matter, vol. 19, 076204, 2007, 12 pages.
Xu, J, et al., "$Cr^{3+}:SrGa_{12}O_{19}$; A Broadband Near-Infrared Long-Persistent Phosphor", Chemistry an Asian Journal, vol. 9, 2014, pp. 1020-1025.
Office Action dated Sep. 30, 2022 issued in corresponding U.S. Appl. No. 17/677,222, 14 pages.
Medina et al., "Colored oxides with hibonite structure 11: Structural and optical properties of $CaAl_{12O19}$-type pigments with chromophores based on Fe, Mn, Cr and Cu", Feb. 24, 2017, Progress in Solid State Chemistry, 45-46, pp. 9-29. (Year: 2017).

* cited by examiner

*Primary Examiner* — Matthew E. Hoban
*Assistant Examiner* — Lynne Edmondson
(74) *Attorney, Agent, or Firm* — Oblon, McClelland, Maier & Neustadt, L.L.P.

(57) ABSTRACT

An object of the present invention is to provide an infrared light-emitting phosphor which emits light in a wavelength range where the sensitivity of a detector is high by combination with a semiconductor light-emitting element that emits light in the visible light region, and to provide an infrared light-emitting device using the infrared light-emitting phosphor. The object can be achieved with a light-emitting device including a semiconductor light-emitting element that emits ultraviolet light or visible light and a phosphor that absorbs ultraviolet light or visible light emitted from the semiconductor light-emitting element and emits light in the infrared region, wherein an emission peak wavelength in the infrared region of the phosphor emitting in the infrared region is from 750 to 1,050 nm, and the half width of an emission peak waveform is more than 50 nm.

19 Claims, 43 Drawing Sheets ns, the present invention has been made in view of such
LIGHT EMITTING DEVICE AND PHOSPHOR

CROSS-REFERENCE TO RELATED APPLICATION

This is a continuation of International Application PCT/JP2018/017535, filed on May 2, 2018, and designated the U.S., and claims priority from Japanese Patent Application 2017-094871 which was filed on May 11, 2017 and Japanese Patent Application 2017-210719 which was filed on Oct. 31, 2017, the entire contents of which are incorporated herein by reference.

TECHNICAL FIELD

The present invention relates to a light-emitting device including a semiconductor light-emitting element and a phosphor, and more particularly to an infrared light-emitting device using a combination of a semiconductor light-emitting element and an infrared light-emitting phosphor. The invention also relates to a phosphor that emits infrared light suitable for producing an infrared light-emitting device.

BACKGROUND ART

As a light-emitting device that emits infrared light, an infrared light-emitting diode using a GaAs-based compound semiconductor as a material is known, and such infrared light-emitting diodes are widely used in the field of a sensor or the like.

However, GaAs-based compound semiconductor light-emitting diodes have problems such as poor temperature characteristics and low versatility. Furthermore, in an infrared light-emitting diode made of a GaAs-based compound semiconductor, the light emission wavelength fluctuates among products due to a slight change in manufacturing conditions, and in order for the infrared light-emitting diode to obtain a predetermined emission wavelength, the yield is lowered and the price is increased, which has been also problematic. Therefore, a more favorable infrared light-emitting device that can solve these problems has been desired. Accordingly, attempts have been made to produce an infrared light-emitting device by combining a GaN-based compound semiconductor light-emitting diode element having high versatility with an infrared light-emitting phosphor.

Patent Literature 1 discloses a light-emitting device composed of a GaN-based compound semiconductor blue light-emitting diode element, a YAG:Ce, Er phosphor that absorbs blue light and emits yellow and infrared light, and a filter for blocking ultraviolet light or visible light.

Patent Literature 2 describes an infrared light-emitting material YAG:Fe, Er having both magnetic characteristics and infrared light-emitting characteristics as a light-emitting compound used in a specific authentication system.

On the other hand, Non-Patent Literature 1 discloses $CaAl_{12}O_{19}:Pr^{3+}$, $Cr^{3+}$ and $SrAl_{12}O_{19}:Pr^{3+}$, $Cr^3$ as a light-emitting material which is excited by ultraviolet light and emits infrared light.

Non-Patent Literature 2 discloses $SrGa_{12}O_{19}:Cr^3$ as a broad-band near infrared phosphor.

Further, Patent Literature 3 discloses an infrared light-emitting device using an infrared light-emitting phosphor having $Cr^{3+}$ or $Ni^{2+}$ as an activator element.

PRIOR ART DOCUMENTS

Patent Literature

Patent Literature 1: JP 2011-233586 A
Patent Literature 2: JP 2013-508809 A
Patent Literature 3: WO 2016/174236

Non-Patent Literature

Non-patent Literature 1: Journal of Physics Condensed Matter, 19 (2007) 076204
Non-patent Literature 2: Chemistry An Asian journal, February 2014, 1020-1025

SUMMARY OF THE INVENTION

Technical Problem

However, there is a problem that received light can not be detected because the emission wavelength of an infrared light-emitting phosphor YAG:Ce, Er disclosed in Patent Literature 1 which is around 1,500 nm is far longer than the range where a light-receiving element Si of a detector can detect. There is a problem that such a phosphor can be excited only by blue light. Further, since a phosphor that emits strong visible light is used, it is necessary to use a means such as a filter to produce a light-emitting device that can obtain only infrared light, and thus the structure as the light-emitting device becomes complicated, which is problematic.

In the infrared light-emitting phosphor material used in Patent Literature 2, the host lattice contains a large amount of elements such as Fe to have magnetic properties, and the light-emitting properties are significantly deteriorated, which is a problematic. Since light emission of Er is around 1,500 nm, as described above, there is a problem that the wavelength is longer than the detection range of the detector and can not be detected by the detector.

On the other hand, although Non-Patent Literature 1 describes $CaAl_{12}O_{19}:Cr^{3+}$ and $SrAl_{12}O_{19}:Cr^{3+}$ as a light-emitting material that emits infrared light, the light emission is in a narrow band where the half width of the light emission peak is narrow, and an infrared light-emitting device using the light-emitting material has a problem that the applicable detection range is limited because the detection range of the detector is limited. Although it is suggested that $Pr^{3+}$ described as an activator ion may transfer energy to $Cr^{3+}$, it is considered that this does not change the characteristics of the above-described emission peak.

Although Non-Patent Literature 2 and Patent Literature 3 disclose infrared light-emitting phosphors using $Cr^{3+}$ as an activator element, a phosphor using $Cr^{3+}$ as an activator element generally has a relatively short emission wavelength in the infrared region, and the afterglow time tends to be long, and there is a problem in practical use as a light-emitting device.

The present invention has been made in view of such problems, and an object thereof is to provide an infrared light-emitting phosphor which emits light in a wide band in a wavelength range where the sensitivity of a detector is high by combining with a semiconductor light-emitting element which emits light in the visible light range, and an infrared light-emitting device using the same.

Solution to Problem

As a result of intensive studies to solve the above problems, the present inventors have found an infrared light-emitting phosphor which emits infrared light in a wavelength range where the sensitivity of an Si detector is high, and which is excited by any of blue, green, and red light emissions of a semiconductor light-emitting element, and found that the above problem can be solved by using this, and arrived at the present invention.

Specifically, the gist of the present invention resides in the following [1] to [20].

[1] A light-emitting device comprising:
a semiconductor light-emitting element that emits ultraviolet light or visible light; and
a phosphor that absorbs ultraviolet light or visible light emitted from the semiconductor light-emitting element and emits light in the infrared region,
wherein an emission peak wavelength in the infrared region of the phosphor emitting in the infrared region is from 750 to 1,050 nm, and the half width of an emission peak waveform is more than 50 nm.

[2] The light-emitting device according to [1],
wherein the phosphor that emits light in the infrared region consists of a phosphor having an afterglow time which is the time taken for the emission peak intensity to fall to 1/10 of the initial emission peak intensity of 10 ms or less.

[3] The light-emitting device according to [1] or [2],
wherein the phosphor that emits light in the infrared region consists of a phosphor having a reflectance at a wavelength from 700 to 850 nm of 80% or more.

[4] The light-emitting device according to [3],
wherein the phosphor that emits light in the infrared region has a reflectance at a wavelength from 700 to 850 nm higher than a reflectance at a wavelength from 300 to 700 nm by 20% or more.

[5] The light-emitting device according to any one of [1] to [4],
wherein the phosphor that emits light in the infrared region comprises at least Cr as an activator element.

[6] The light-emitting device according to any one of [1] to [5],
wherein the phosphor that emits light in the infrared region comprises at least $Eu^{2+}$ or $Sm^{2+}$ as an activator element.

[7] The light-emitting device according to any one of [1] to [6],
wherein the phosphor that emits light in the infrared region has a magnet plumbite structure as a crystal phase.

[8] The light-emitting device according to any one of [1] to [7],
wherein the phosphor that emits light in the infrared region is represented by the following Formula (1).

$$(M1_{1-b}M2_b)(M3_{1-d}M4_d)_{12}O_{19} \quad (1),$$

where
M1 represents one or more metal elements selected from alkaline earth metal elements other than Mg;
M2 represents one or more metal elements selected from rare earth metal elements other than Sc;
M3 represents two or more metal elements comprising at least Ga and comprising one or more metal elements selected from Mg, Zn, B, Al, In, Sc, Si, Ge, Ti, Sn, Zr, and Hf;
M4 represents one or more metal elements selected from Cr, Mn, Fe, Ni, and Cu;
O represents oxygen; and
$0 \leq b \leq 1$ and $0 < d \leq 0.5$.

[9] A phosphor comprising a crystal phase of a chemical composition represented by the following Formula (2) and having an emission peak wavelength in a wavelength range of 750 nm to 1,050 nm.

$$(A1_{1-a}A2_a)(A3_{1-c}A4_c)_{12}O_{19} \quad (2)$$

where
A1 represents one or more metal elements selected from alkaline earth metal elements other than Mg;
A2 represents one or more metal elements selected from rare earth metal elements other than Sc;
A3 represents one or more metal elements comprising at least Al;
A4 represents one or more metal elements selected from Cr, Mn, Fe, Ni, and Cu;
O represents oxygen; and
$0 \leq a \leq 1$ and $0 < c \leq 0.5$.

[10] The phosphor according to [9],
wherein the metal element A3 in the Formula (2) further comprises one or more metal elements selected from Mg, Zn, B, Ga, In, Sc, Si, Ge, Ti, Sn, Zr, and Hf.

[11] The phosphor according to [9] or [10],
wherein the metal element A3 in the Formula (2) comprises Al and Ga.

[12] The phosphor according to any one of [9] to [11],
wherein $0 < a \leq 1$ in the Formula (2).

[13] The phosphor according to any one of [9] to [12],
wherein the metal element A2 in the Formula (2) comprises at least Tm.

[14] The phosphor according to any one of [9] to [13],
wherein the metal element A1 in the Formula (2) comprises at least Ca or Sr.

[15] The phosphor according to any one of [9] to [14],
wherein the metal element A4 in the Formula (2) comprises at least Cr.

[16] The phosphor according to any one of [9] to [15],
wherein the phosphor has an afterglow time which is the time taken for the emission peak intensity to fall to 1/10 of the initial emission peak intensity of 10 ms or less.

[17] The phosphor according to any one of [9] to [16],
wherein the half width of an emission peak waveform is more than 50 nm.

[18] A light-emitting device comprising:
a semiconductor light-emitting element that emits ultraviolet light or visible light; and
a phosphor that absorbs ultraviolet light or visible light emitted from the semiconductor light-emitting element and emits light in the infrared region,
wherein the phosphor emitting in the infrared region is the phosphor according to any one of [9] to [17],

[19] An image recognition apparatus comprising:
a semiconductor light-receiving element having a spectral sensitivity at a wavelength range of 750 to 1,050 nm; and
the light-emitting device according to any one of [1] to [8] and [18].

[20] An analysis apparatus analyzing blood and/or food and comprising:
a semiconductor light-receiving element having a spectral sensitivity at a wavelength range of 750 to 1,050 nm; and
the light-emitting device according to any one of [1] to [8] and [18].

Advantageous Effects of Invention

According to the present invention, an infrared light-emitting device which emits light in a wide band at from 750 to 1,050 nm where the detection sensitivity of a Si detector is high can be provided. A light-emitting device in which only desired infrared light emission can be obtained without taking a complicated configuration such as a filter can be provided.

According to the present invention, an infrared light-emitting phosphor that emits light from 750 to 1,050 nm, in which the detection sensitivity of a Si detector is high can be provided. The phosphor is a phosphor with high light emission efficiency, since the phosphor is a phosphor which emits light of a desired infrared wavelength and emits considerably little light at other wavelengths.

DESCRIPTION OF EMBODIMENTS

Figure 1:
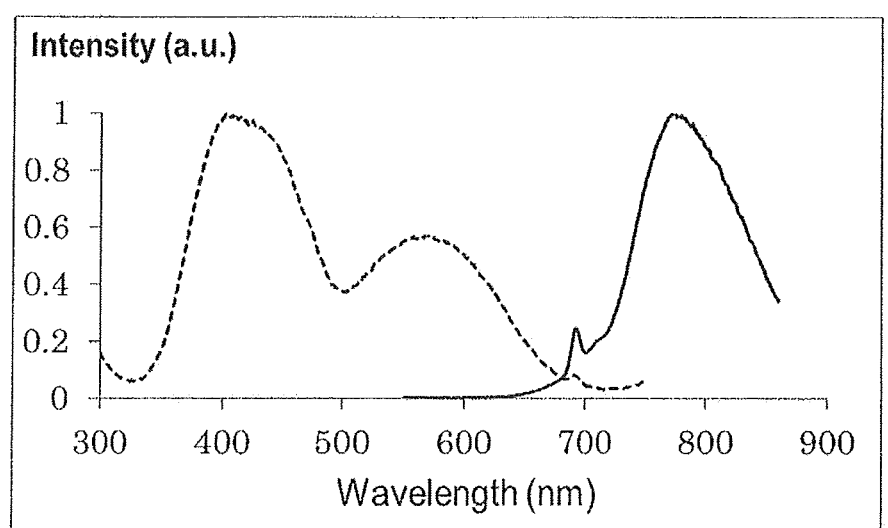
FIG. 1 shows excitation and emission spectra of a phosphor of Example 1.

Hereinafter, embodiments of the present invention will be described in detail. The present invention is not limited to the contents described below, and can be arbitrarily changed and implemented without departing from the scope of the present invention.

Herein, a numerical range represented using "to" means a range including numerical values described before and after "to" as the lower limit value and the upper limit value.

Delimitation of composition formulas of phosphors herein is represented by a comma and a space (,). A plurality of listed elements separated with a comma (,) indicate that one or two or more of the listed elements may be contained in a phosphor in any combination and composition.

<1. Light-Emitting Device>

The light-emitting device according to a first aspect of the present invention includes: a semiconductor light-emitting element that emits ultraviolet light or visible light; and a phosphor that absorbs ultraviolet light or visible light emitted from the semiconductor light-emitting element and emits light in the infrared region (hereinafter, sometimes referred to as "infrared phosphor"), and is characterized in that the emission peak wavelength in the infrared region of the phosphor emitting in the infrared region is from 750 to 1,050 nm, and the half width of the emission peak waveform is more than 50 nm.

Herein, "ultraviolet light" means light having a wavelength of less than 400 nm, and "visible light" means light having a wavelength of from 400 nm to 700 nm.

{Semiconductor Light-Emitting Element}

The semiconductor light-emitting element used in the light-emitting device according to a first aspect of the present invention is not particularly limited as long as the element emits ultraviolet light or visible light and functions as an excitation light source. The light emission peak wavelength from the semiconductor light-emitting device is preferably from 300 and 700 nm, since semiconductor light-emitting devices are widely used as a semiconductor light-emitting device and are inexpensive and easy to obtain. The wavelength of the emission peak is more preferably from 350 to 680 nm, and still more preferably from 420 to 480 nm or from 600 to 650 nm. A so-called blue light-emitting element or a red light-emitting element can be preferably used.

Here, "emission peak wavelength" means the largest peak among emission peaks at a wavelength range of 300 to 700 nm.

{Infrared Phosphor}

A phosphor used in the light-emitting device according to the first aspect of the present invention is an infrared phosphor that absorbs ultraviolet light or visible light emitted from a semiconductor light-emitting element and emits light in the infrared region, and is characterized in that the emission peak wavelength in the infrared region of the phosphor emitting in the infrared region is from 750 to 1,050 nm, and the half width of the emission peak waveform is more than 50 nm.

Here, the emission peak in the infrared region of an infrared phosphor means one or a plurality of emission peaks existing at a wavelength range of 750 to 1,050 nm in a single type of phosphor. Preferably, the peak means the largest emission peak among emission peaks at a wavelength range of 750 to 1,050 nm. Accordingly, the emission peak wavelength in the infrared region means one or a plurality of wavelengths which produce one or a plurality of emission peaks in a wavelength range of 750 to 1,050 nm, and preferably a wavelength which produces the largest emission peak among emission peaks at a wavelength range of 750 to 1,050 nm.

The half width of an emission peak waveform usually means a width between two wavelengths at which the intensity is half the emission peak at a wavelength range of 750 to 1,050 nm. When emission peaks are overlapped to each other, a half width means a width between two wavelengths at which the intensity is half the maximum emission peak of the overlapping emission peaks. For example, in the emission spectrum of the phosphor of the embodiment shown in FIG. 9 where the emission peaks are respectively at 773 nm and 793 nm, and the waveforms are partially overlapped, the half width was calculated by measuring a width between two wavelengths of 756 nm and 848 nm at which the intensities are half the wavelength of the maximum emission peak at 793 nm.

The fact that the half width of the emission peak of an infrared phosphor being more than 50 nm means that the half width of one or more of emission peaks at a wavelength range of 750 to 1,050 nm is more than 50 nm.

[Emission Spectrum]

The infrared phosphor used in the light-emitting device according to the first aspect of the present invention preferably has the following feature when the phosphor is excited by light having a peak wavelength of from 300 nm to 700 nm and the emission spectrum is measured.

The emission peak wavelength $\lambda p$ (nm) in the above-described emission spectrum is usually 750 nm or more, more preferably 770 nm or more, and further preferably 780 nm or more, and usually 1,050 nm or less, more preferably 1,000 nm or less, and further preferably 950 nm or less.

The wavelength is preferably in the above range from the viewpoint of obtaining suitable infrared emission.

The infrared phosphor used in the light-emitting device according to the first aspect of the present invention has a half width of the emission peak wavelength in the above emission spectrum of usually more than 50 nm, preferably 60 nm or more, more preferably 70 nm or more, still more preferably 100 nm or more, and further preferably 150 nm or more, and usually 500 nm or less.

The half width of the emission peak wavelength in the emission spectrum is preferably within the above range since the light-emitting device according to the first aspect of the present invention tends to be easy to use as an infrared light source in a wide wavelength range. Usually, since light emitted from an infrared light-emitting device is detected by various detectors depending on applications, it is preferable that light emission corresponding to the detection wavelength of the detector is strong.

On the other hand, since detection wavelengths of a detector are used in various ways, it is demanded from the viewpoint of product efficiency to manufacture infrared light-emitting devices corresponding to these various detection wavelengths. A light-emitting device that emits light in a wide band has heretofore been developed by combining various infrared phosphors having different emission peak wavelengths. However, the light emission wavelength of such a light-emitting device is uneven, and such a device is not practical as an infrared light source corresponding to various detection wavelengths.

As a result of examination by the present inventors, it has been found that, by producing a light-emitting device using a phosphor having a broader emission peak wavelength, infrared light emission in a wide wavelength range can be obtained without unevenness in the infrared region. Since it is not necessary to use a phosphor inferior in performance other than the light emission wavelength such as stability and afterglow time, a light-emitting device with excellent characteristics can be obtained. Such an infrared light-emitting device is preferable since such a device can be applied to an infrared light source for many applications.

In order to excite the above-described infrared phosphor with light having a peak wavelength of from 300 nm to 700 nm, for example, a xenon light source can be used. The emission spectrum of the phosphor can be measured, for example, using a fluorescence spectrophotometer F-4500 or F-7000 (manufactured by Hitachi, Ltd.). The emission peak wavelength and the half width of the emission peak waveform can be calculated from the obtained emission spectrum.

[Excitation Spectrum]

The infrared phosphor used in the light-emitting device according to the first aspect of the present invention includes an excitation peak in the wavelength range of usually 300 nm or more, preferably 350 nm or more, and more preferably 400 nm or more, and usually 700 nm or less, preferably 650 nm or less, and more preferably 600 nm or less. In other words, excitation is performed by light in the near ultraviolet to deep red region.

[Afterglow Time]

An infrared phosphor used in the light-emitting device according to the first aspect of the present invention preferably has an afterglow time which is the time taken for the emission peak intensity to fall to $\frac{1}{10}$ of the initial emission peak intensity of 10 ms or less. The afterglow time is more preferably 8 ms or less, and still more preferably 6 ms or less, and usually 1 ns or more. When the afterglow time is short, the amount of phosphor used in the light-emitting device tends to be reduced, and when displaying an image, a fast-moving image tends to be easily displayed, which is preferable. The emission peak intensity is preferably an emission peak intensity in the infrared region.

Afterglow time can be measured using a normal fluorescence spectrophotometer. For example, measurement can be performed by the following method.

Using a fluorescence spectrophotometer F-7000 (manufactured by Hitachi, Ltd.), excitation light with a wavelength of 455 nm is irradiated once at room temperature (25° C.), and the intensity change of the emission peak after the irradiation is stopped is measured. The initial intensity is set to 1.0, and the time taken for the intensity to fall to $\frac{1}{10}$ of the initial intensity is set to the afterglow time.

In the light-emitting device according to the first aspect of the present invention, a plurality of infrared phosphors can be used in combination, and the afterglow time of any of the infrared phosphors is preferably within the above range. In other words, the infrared phosphor used by the light-emitting device according to the first aspect of the present invention preferably consists of a phosphor which has an afterglow time which is the time taken for the emission peak intensity to fall to $\frac{1}{10}$ of the initial emission peak intensity of 10 ms or less. By this, the afterglow time of the obtained light-emitting device itself can be adjusted to 10 ms or less.

[Reflectance]

The infrared phosphor used in the light-emitting device according to first aspect of the present invention preferably has a high reflectance in the light emission wavelength region. By selecting such a phosphor, the light emission efficiency of the light-emitting device according to the first aspect of the present invention can be increased.

Specifically, the infrared phosphor used in the light-emitting device of the present invention preferably consists of a phosphor having a reflectance at a wavelength range of 700 to 850 nm of 80% or more, more preferably 85% or more, and still more preferably 90% or more.

In an infrared phosphor used in the light-emitting device according to the first aspect of the present invention, the reflectance at a wavelength range of 700 to 850 nm (R1) is higher than the reflectance at a wavelength range of 300 to 700 nm (R2), and the difference is preferably 20% or more, more preferably 25% or more, and still more preferably 30% or more.

[Stability]

An infrared phosphor used in the light-emitting device according to the first aspect of the present invention is preferably highly water resistant and heat resistant, and stable.

By selecting such a phosphor, the durability of the light-emitting device according to the first aspect of the present invention can be improved to enable long-term use.

[Quantum Efficiency and Absorption Efficiency]

The external quantum efficiency ($\eta_o$) of an infrared phosphor used in the light-emitting device according to the first aspect of the present invention is usually 25% or more, preferably 40% or more, and more preferably 50% or more. The higher the external quantum efficiency, the higher the light emission efficiency of a phosphor, which is preferable.

The internal quantum efficiency ($\eta_i$) of an infrared phosphor used in the light-emitting device according to the first aspect of the present invention is usually 30% or more, preferably 50% or more, more preferably 70% or more, and still more preferably 90% or more. The internal quantum efficiency means the ratio of the number of emitted photons to the number of photons of excitation light absorbed by the infrared phosphor. Accordingly, the higher the internal quantum efficiency, the higher the light emission efficiency and the light emission intensity of the infrared phosphor, which is preferable.

The absorption efficiency of an infrared phosphor used in the light-emitting device according to the first aspect of the present invention is usually 30% or more, preferably 40% or more, more preferably 50% or more, and still more preferably 60% or more. The higher the absorption efficiency, the higher the light emission efficiency of the phosphor and the smaller the amount of infrared phosphor used, which is preferable.

[Composition]

The infrared phosphor used in the light-emitting device according to the first aspect of the present invention is not particularly limited in the composition or crystal structure as long as the phosphor has a desired emission peak wavelength. In particular, for the emission peak wavelength in the infrared region to be at a wavelength range of 750 and 1050 nm, the phosphor preferably includes, as an activator element, one or more elements selected from the group consisting of Cr, $Eu^{2+}$, and $Sm^{2+}$. Herein, "Cr", as the activator element, may comprise $Cr^{3+}$ and/or $Cr^{4+}$. By including Cr, it becomes easy to obtain light emission at a desired wavelength. By including $Eu^{2+}$ or $Sm^{2+}$, a wide excitation band and high absorption intensity can be obtained, and the amount of infrared phosphor used in the light-emitting device tends to be small.

A rare earth metal element and a transition metal element other than Cr may be included as a sensitizer that absorbs and sensitizes excitation light from the semiconductor light-emitting element or an activator element that emits infrared light. Examples of the rare earth metal elements and transition metal elements other than Cr include Mn which may comprise $Mn^{3+}$ and/or $Mn^{4+}$, and Cu which may comprise $Cu^+$ and/or $Cu^{2+}$.

Also, when it is desired to change the emission peak wavelength λp (nm) to be obtained, an element other than Cr is preferably used as an activator element in combination. For example, when a rare earth metal element is used in combination, light emission from the rare earth metal element is added to light emission from Cr, and therefore, a wider emission wavelength range can be obtained.

The composition of an infrared phosphor can be confirmed by a generally known method. For example, the composition can be measured by X-ray diffraction (XRD), X-ray fluorescence (XRF), composition analysis by scanning electron microscope and energy dispersive X-ray spectrometer (SEM-EDX), electron probe microanalyzer (EPMA), inductively coupled plasma optical emission spectrometry (ICP-OES), inductively coupled plasma mass spectrometry (ICP-MS), atomic absorption spectrometry (AAS), or ion chromatograph (IC).

An infrared phosphor used in the light-emitting device according to the first aspect of the present invention can have various crystal structures as a crystal phase, and examples thereof include perovskite, garnet, and magnet plumbite structure.

Specific examples of the infrared phosphor used in the light-emitting device according to the first aspect of the present invention include a phosphor represented by the following Formula (1)

$$(M1_{1-b}M2_b)(M3_{1-d}M4_d)_{12}O_{19} \tag{1},$$

where

M1 represents one or more metal elements selected from alkaline earth metal elements other than Mg;

M2 represents one or more metal elements selected from rare earth metal elements other than Sc;

M3 represents two or more metal elements including at least Ga and including one or more metal elements selected from Mg, Zn, B, Al, In, Sc, Si, Ge, Ti, Sn, Zr, and Hf;

M4 represents one or more metal elements selected from Cr, Mn, Fe, Ni, and Cu;

O represents oxygen; and $0 \leq b \leq 1$ and $0 < d \leq 0.5$.

M1 represents one or more metal elements selected from alkaline earth metal elements other than magnesium (Mg). Examples of such metal elements include calcium (Ca), strontium (Sr), and barium (Ba).

M1 may be partially replaced by another element within a range not to impair an effect of an infrared phosphor used in the light-emitting device according to the first aspect of the present invention. Examples of other elements include sodium (Na), potassium (K), rubidium (Rb), and cesium (Cs).

M2 represents one or more metal elements selected from rare earth metal elements other than scandium (Sc). Examples of such metal elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holomium (Ho), erbium (Er), thulium (Tm), ytterbium (Yb), and lutetium (Lu). Preferred examples among these include La, Nd, Tm, and Yb.

M3 represents two or more metal elements containing at least gallium (Ga) and containing one or more metal elements selected from magnesium (Mg), zinc (Zn), boron (B), aluminum (Al), indium (In), scandium (Sc), silicon (Si), germanium (Ge), titanium (Ti), tin (Sn), zirconium (Zr), and hafnium (Hf). It is preferable to contain a metal element other than Ga as compared to a case in which M3 consists of Ga, since the water resistance and heat resistance of a phosphor are high and the phosphor becomes stable. In particular, when used as an infrared light-emitting device, the stability of a light-emitting device itself is enhanced, which is preferable.

Because of ease of activation of an activator element, preferably, M3 contains at least Ga and Al, more preferably, 10% by mole or more of M3 is Al and/or Ga, still more preferably, 50% by mole or more of M3 is Al and/or Ga, and still more preferably, M3 is Al and Ga.

The ratio of metal elements other than Ga in M3 is preferably 10% by mole or more, more preferably 20% by mole or more, and still more preferably 30% by mole or more.

When M3 contains Ga and a metal element other than Ga, adjustment of the excitation wavelength and the emission wavelength becomes possible, which tends to facilitate provision of an infrared phosphor suitable for an intended light-emitting device.

M4 represents one or more metal elements selected from chromium (Cr), manganese (Mn), iron (Fe), nickel (Ni), and copper (Cu). Because of ease of absorption of ultraviolet light and visible light, preferably, M4 contains at least Cr or Mn, preferably, 10% by mole or more of M4 is Cr and/or Mn, and more preferably, M4 is Cr or Mn. A metal element which has magnetic properties such as Fe is preferably 50% by mole or less.

O represents oxygen, and may be partially replaced by another element within the range that does not impair an effect of an infrared phosphor used in the light-emitting device according to the first aspect of the present invention. Examples of other elements include chlorine (Cl), fluorine (F), bromine (Br), iodine (I), sulfur (S), and nitrogen (N).

1-b represents the content of M1, usually satisfies $0 \leq 1-b \leq 1$, and the lower limit value thereof is preferably 0.5 or more, and more preferably 0.7 or more, and the upper limit value thereof is preferably 0.99 or less, and more preferably 0.90 or less.

b represents the content of M2, usually satisfies $0 \leq b \leq 1$, and the lower limit value thereof is preferably 0.01 or more, and more preferably 0.05 or more, and the upper limit value thereof is preferably 0.5 or less, and more preferably 0.3 or less.

1-d represents the content of M3, usually satisfies $0.5 \leq 1-d < 1$, and the lower limit value thereof is preferably 0.7 or more, and more preferably 0.8 or more, and the upper limit value thereof is preferably 0.999 or less, and more preferably 0.990 or less.

d represents the content of M4, usually satisfies $0 < d \leq 0.5$, and the lower limit value thereof is preferably 0.001 or more, more preferably 0.005 or more, and particularly preferably 0.01 or more, and the upper limit value thereof is preferably 0.3 or less, more preferably 0.2 or less, and particularly preferably 0.015 or less.

Particularly preferred specific example of the infrared phosphor used in the light-emitting device according to the first aspect of the present invention include the $Cr^{3+}$-activated oxide phosphor described below. The phosphor represented by the above-described Formula (1) can be manufactured in accordance with the method of producing a $Cr^{3+}$-activated oxide phosphor described below.

{Light-Emitting Device}

The light-emitting device according to the first aspect of the present invention is a light-emitting device including the above-described semiconductor light-emitting element as a first light emitter (excitation light source) and the above-described infrared phosphor as a second light emitter that absorbs ultraviolet light or visible light emitted from the first light emitter and emits infrared light. Here, the infrared phosphors may be used singly, or in any combination of two or more kinds thereof in any ratio. In order for a light-emitting device to obtain the emission spectrum described below, two or more kinds of infrared phosphors are preferably used in any combination. More specifically, the light-emitting device preferably at least includes: one or more infrared phosphors having an emission peak at a wavelength range of 750 to 900 nm; and one or more infrared phosphors having an emission peak at a wavelength range of 900 to 1,050 nm.

[Configuration of Light-Emitting Device]

The configuration of a light-emitting device is not limited except that the light-emitting device includes a first light emitter (excitation light source), and uses at least the above-described infrared phosphor as a second light emitter, and any known device configuration can be adopted.

Examples of the embodiment of the device configuration and the light-emitting device include those described in JP 2007-291352 A.

Examples of the other form of the light-emitting device include a cannonball type, a cup type, a chip on board, and a remote phosphor.

[Emission Spectrum of Light-Emitting Device]

The light-emitting device according to the first aspect of the present invention preferably has the following features when the emission spectrum is measured. When there is only one type of infrared phosphor used in the light-emitting device, the emission spectrum of the light-emitting device is considered to correspond to the emission spectrum of the infrared phosphor used, and when a plurality of infrared phosphors are used, it is preferable to select an infrared phosphor in such a manner that the following features are provided.

It is preferable that more emission peaks in the emission spectrum are present usually from 750 to 1,050 nm. Depending on the application of the light-emitting device, the lower limit thereof is preferably 770 nm or more, and more preferably 780 nm or more, and the upper limit is preferably 1,050 nm or less.

Furthermore, when a plurality of infrared phosphors are used, it is preferable that the emission intensity ratio (P2/P1) of an emission intensity (P2) of a valley between an emission peak and an emission peak adjacent thereto to the intensity (P1) of the emission peak is small in the emission spectrum of a light-emitting device by combination of infrared phosphors. The P2/P1 is usually 0.01 or more, preferably 0.02 or more, more preferably 0.03 or more, and particularly preferably 0.05 or more, and usually 0.5 or less, preferably 0.4 or less, more preferably 0.3 or less, and particularly preferably 0.2 or less.

In the emission spectrum of the light-emitting device according to the first aspect of the present invention, the half width of the waveform of each emission peak is usually more than 50 nm, preferably 60 nm or more, more preferably 70 nm or more, still more preferably 100 cm or more, and still more preferably 150 nm or more, and usually 500 nm or less, preferably 475 nm or less, more preferably 450 nm or less, still more preferably 400 nm or less, and further preferably 350 nm or less.

The half width of the waveform of an emission peak in the emission spectrum of a light-emitting device usually means a width between two wavelengths at which the value is half the emission peak at a wavelength range of 750 to 1,050 nm. In the case of using a plurality of types of infrared phosphors, a plurality of emission peaks may overlap. In such cases, the half width may be considered as a width between two wavelengths at which is the value is half the value of the largest emission peak among the overlapping emission peaks.

[Afterglow Time]

In the light-emitting device according to the first aspect of the present invention, it is preferable that an afterglow time which is the time taken for the emission peak intensity to fall to 1/10 of the initial emission peak intensity is 10 ms or less. The afterglow time is more preferably 8 ms or less, and still more preferably 6 ms or less, and usually 1 ns or more. When a light-emitting device is used as a pulse light source or used as a light source for applications involving switching of emission wavelength, a short afterglow time is preferable since an influence of afterglow can be reduced. The emission peak intensity is preferably an emission peak intensity in the infrared region.

The afterglow time of a light-emitting device can be measured by a measuring device of a normal LED light-emitting device.

{Application of Light Emitting Device}

Applications of the light-emitting device are not particularly limited, and the light-emitting device can be used in various fields where a normal infrared light-emitting device is used. For example, a light source of an infrared monitoring device, a light source of an infrared sensor, an infrared light source of a medical diagnostic device, or a light source of a transmitting element such as a photoelectric switch or a video game joystick may be used.

Specifically, a light-emitting device can be used as: an image recognition apparatus including a semiconductor light-receiving element having spectral sensitivity at a wavelength range of 750 to 1,050 nm and the light-emitting device; an analysis apparatus for analyzing blood and/or food, comprising a semiconductor light-receiving element having spectral sensitivity at a wavelength range of 750 to 1,050 nm and the light-emitting device; or the like.

<2. Phosphor 1>

A second aspect of the present invention is a phosphor comprising a crystal phase of a chemical composition represented by the following Formula (2) and having an emission peak wavelength of from 750 nm to 1,050 nm.

$$(A1_{1-a}A2_a)(A3_{1-c}A4_c)_{12}O_{19} \qquad (2)$$

where

A1 represents one or more metal elements selected from alkaline earth metal elements other than Mg;

A2 represents one or more metal elements selected from rare earth metal elements other than Sc;

A3 represents one or more metal elements including at least Al;

A4 represents one or more metal elements selected from Cr, Mn, Fe, Ni, and Cu;

O represents oxygen; and $0 \leq a \leq 1$ and $0 < c \leq 0.5$.

[Composition]

A1 represents one or more metal elements selected from alkaline earth metal elements other than magnesium (Mg). Examples of such metal elements include calcium (Ca), strontium (Sr), and barium (Ba). Among them, A1 preferably contains at least Ca or Sr, more preferably contains 50% by mole or more of Ca or Sr, still more preferably 80% by mole or more of Ca or Sr, and still more preferably is Ca or Sr. When the proportion of metal elements other than A1 in A3 described below is increased, it is preferable to include Sr since the stability of a phosphor becomes high.

A1 may be partially replaced by another element within a range not to impair an effect of an infrared phosphor. Examples of other elements include sodium (Na), potassium (K), rubidium (Rb), and cesium (Cs). These elements are preferably used for charge compensation when part of A1 is replaced by A2.

A2 represents one or more metal elements selected from rare earth metal elements other than scandium (Sc). Examples of such metal elements include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holomium (Ho), erbium (Er), thulium (Tm), ytterbium (Yb), and lutetium (Lu). Preferred examples among these include La, Nd, Tm, and Yb, and it is preferable to include at least Tm. More preferably, A2 contains 50% by mole or more of Tm, more preferably contains 80% by mole or more of Tm, and even more preferably is Tm.

A3 represents one or more metal elements containing at least aluminum (Al). A3 may further contain two or more metal elements other than Al. Here, the metal element other than Al is not particularly limited as long as the metal is a metal element different from A1, A2, and A4. When the metal element different from A1, A2, and A4 is not contained, preferably 20% by mole or more of A3 is Al, more preferably 50% by mole or more is Al, more preferably 80% by mole or more is Al, and still more preferably A3 is Al.

In addition to Al, A3 preferably further includes one or more metal elements selected from magnesium (Mg), zinc (Zn), boron (B), gallium (Ga), indium (In), scandium (Sc), silicon (Si), germanium (Ge), titanium (Ti), tin (Sn), zirconium (Zr), and hafnium (Hf). In particular, A3 preferably contains Al and Ga, and the ratio of Al and Ga in A3 or Al/(Al+Ga) is preferably 10% by mole or more. As compared to cases in which A3 consists of Al, containing a metal element other than Al is preferable since the excitation wavelength and the emission wavelength of a phosphor can be easily controlled. In particular, when used as an infrared light-emitting device, it is preferable to contain a metal element other than Al since the light-emitting wavelength of a light-emitting device itself can be easily controlled. As described below, this is considered to be because, in the crystal structure of a phosphor, the emission wavelength tends to be easily adjusted to the long wavelength side since the bonding distance between an activator element which is introduced by replacement of Al and a coordinated oxygen increases or the bonding angle changes.

Because of ease of activation of an activator element, preferably, A3 contains at least Al and Ga, more preferably, 10% by mole or more of A3 is Al and Ga, still more preferably, 50% by mole or more of A3 is Al and Ga, and still more preferably, A3 is Al and Ga.

The ratio of metal elements other than Al in A3 is preferably 10% by mole or more, more preferably 20% by mole or more, and still more preferably 30% by mole or more. The upper limit value is not particularly limited, and in the case of Ga, the Ga content is preferably 80% by mole or less, more preferably 70% by mole or less, and still more preferably 60% by mole or less. When the proportion of a metal element other than Al is too high, the stability of a phosphor tends to decrease, which is not preferable.

A4 represents one or more metal elements selected from chromium (Cr), manganese (Mn), iron (Fe), nickel (Ni), and copper (Cu). Because of ease of absorption of ultraviolet light and visible light, preferably, A4 contains at least Cr, more preferably, 10% by mole or more of A4 is Cr, still more preferably, 50% by mole or more of A4 is Cr, and further preferably, A4 is Cr. Cr strongly absorbs ultraviolet light or visible light, and can emit light in a wide range in the infrared region.

A metal element which has magnetic properties such as Fe is preferably 50% by mole or less.

O represents oxygen, and may be partially replaced by another element within the range that does not impair an effect of the phosphor according to the second aspect of the present invention. Examples of other elements include chlorine (Cl), fluorine (F), bromine (Br), iodine (I), sulfur (S), and nitrogen (N).

In Formula (2), 1-a represents the content of A1, usually satisfies $0 \leq 1-a \leq 1$, and the lower limit value thereof is preferably 0.5 or more, and more preferably 0.7 or more, and the upper limit value thereof is preferably 0.99 or less, and more preferably 0.90 or less.

In Formula (2), a represents the content of A2, usually satisfies $0 \leq a \leq 1$ and preferably satisfies $0 < a \leq 1$. The lower limit value thereof is more preferably 0.01 or more, and still more preferably 0.05 or more, and the upper limit value thereof is preferably 0.5 or less, and more preferably 0.3 or less.

In the case of $0 < a \leq 1$, a phosphor contains two or more activator elements. Two or more types of activator elements can function as sensitizing ions and light-emitting ions, respectively, and are preferable since adjustment of a desired light emission wavelength becomes easy.

In Formula (2), 1-c represents the content of A3, usually satisfies $0.5 \leq 1-c \leq 1$, and the lower limit value thereof is preferably 0.7 or more, and more preferably 0.8 or more, and the upper limit value thereof is preferably 0.999 or less, and more preferably 0.990 or less.

In Formula (2), c represents the content of A4, usually satisfies $0 < c \leq 0.5$, and the lower limit value thereof is preferably 0.001 or more, more preferably 0.005 or more, and particularly preferably 0.01 or more, and the upper limit value thereof is preferably 0.3 or less, more preferably 0.2 or less, and particularly preferably 0.015 or less.

[Crystalline Structure]

The phosphor according to the second aspect of the present invention preferably includes a crystal phase having a magnet plumbite structure.

In the phosphor according to the second aspect of the present invention, the lattice volume of a crystal phase of the phosphor is preferably from 585.8 Å$^3$ to less than 661.10 Å$^3$. By adjusting the lattice volume to the above range, it becomes easy to adjust the emission wavelength to 750 nm or more. In particular, also in a phosphor using Cr as an activator element, which is conventionally known to emit light with a main emission peak of 700 nm or less, astonishingly, the present inventors have made it possible to emit light in a wavelength of 750 nm or more.

The means for achieving the lattice volume in the above range is not particularly limited, and examples thereof include: partial replacement of an element larger than Al in A3 in Formula (2) such as Ga; partial replacement of an element which is an alkaline earth metal element and is larger than Ca in A1 in Formula (2) such as Sr or Ba; and introduction of a defect due to high temperature firing to keep the lattice volume within a desired range.

The description of "Infrared Phosphor" in the first aspect is incorporated into the description of characteristics of the phosphor according to the second aspect of the present invention (emission spectrum, excitation spectrum, afterglow time, stability, and quantum efficiency and absorption efficiency).

A light-emitting device can be obtained by combining the phosphor according to the second aspect of the present invention with a semiconductor light-emitting element that emits ultraviolet light or visible light.

Specifically, a light-emitting device including: a semiconductor light-emitting element that emits ultraviolet light or visible light; and a phosphor that absorbs ultraviolet light or visible light emitted from the semiconductor or light-emitting element and emits light in the infrared region, wherein the phosphor emitting in the infrared region contains a crystal phase of the chemical composition represented by Formula (2), and has an emission peak wavelength at from 750 nm to 1,050 nm can be configured. The description of "Light-Emitting Device" in the first aspect is incorporated into the description of the characteristics of the light-emitting device.

<3. Phosphor 2>

A third aspect of the present invention is a Cr$^{3+}$-activated oxide phosphor characterized by having the chemical composition represented by Formula (1') described below, containing a crystal phase having a magnet plumbite structure, having a peak emission wavelength at a wavelength range of 750 to 1,050 nm, and having a half width of the waveform of a light emission peak of 50 nm or more.

$$(M1_{1-b}M2_b)(M3_{1-d}M4_d)_{12}O_{19} \qquad (1')$$

where

M1 represents one or more metal elements selected from alkaline earth metal elements other than Mg;

M2 represents one or more metal elements selected from rare earth metal elements other than Sc;

M3 represents two or more metal elements including at least Ga and including one or more metal elements selected from Mg, Zn, B, Al, In, Sc, Si, Ge, Ti, Sn, Zr, and Hf;

M4 represents one or more metal elements selected from Cr, Mn, Fe, Ni, and Cu;

O represents oxygen; and $0 \leq b \leq 1$ and $0 < d \leq 0.5$.

M1 represents one or more metal elements selected from alkaline earth metal elements other than Mg. A specific example, a preferable range, and the like are the same as those of M1 in above-described Formula (1).

M2 represents one or more metal elements selected from rare earth metal other than Sc. A specific example, a preferable range, and the like are the same as those of M2 in above-described Formula (1).

M3 represents two or more metal elements containing at least Ga and containing one or more metal elements selected from Mg, Zn, B, Al, In, Sc, Si, Ge, Ti, Sn, Zr, and Hf. A specific example, a preferable range, and the like are the same as those of M3 in above-described Formula (1). In particular, M3 preferably contains Al and Ga, and the ratio of Al and Ga in M3 or Al/(Al+Ga) is preferably 10% by mole or more.

M4 represents one or more metal elements selected from Cr, Mn, Fe, Ni, and Cu. More preferably, 10% by mole or more of M4 is Cr, and further preferably, M4 is Cr. Cr strongly absorbs ultraviolet light or visible light, and can emit light in a wide range in the infrared region. A specific example, a preferable range, and the like are the same as those of M4 in above-described Formula (1).

O represents oxygen, and may be partially replaced by another element within the range that does not impair an effect of the phosphor according to the third aspect of the present invention. Examples of other elements include chlorine (Cl), fluorine (F), bromine (Br), iodine (I), sulfur (S), and nitrogen (N).

Although 1-b, b, 1-d, and d in Formula (1') each represent the content of each element, a specified numerical range and preferable range are considered to be the same as the ranges described in detail in the above-described Formula (1).

The description of "Infrared Phosphor" in the first aspect is incorporated into the description of characteristics of the phosphor according to the third aspect of the present invention (emission spectrum, excitation spectrum, afterglow time, stability, and quantum efficiency and absorption efficiency).

<4. Method of Manufacturing Phosphor>

Hereinafter, a phosphor used in the first aspect of the present invention, and phosphors according to the second aspect and the third aspect may be collectively referred to as "phosphor of the present invention", "phosphor according to the present invention", or the like.

The method of manufacturing a phosphor of the present invention can include a step of mixing raw materials such as a chloride, a fluoride, an oxide, a carbonate, and a nitrate of respective elements, a firing step, a crushing step, and a washing and classification step.

[Phosphor Raw Material]

As a phosphor raw material used in the method of manufacturing a phosphor of the present invention, a well-known material can be used unless an effect of the present invention is impaired. Specific examples of M1 source, M2 source, M3 source, and M4 source are shown below, but the present invention is not limited thereto. In the second aspect of the present invention, M1 source, M2 source, M3 source, and M4 source can be read as A1 source, A2 source, A3 source, and A4 source, respectively.

As the M1 source, an oxide, a hydroxide, a carbonate, a nitrate, a sulfate, a phosphate, a chloride, a fluoride, a bromide, an iodide, and a hydrate thereof each containing an M1 element can be used.

As the M2 source, an oxide, a hydroxide, a carbonate, a nitrate, a sulfate, a phosphate, a chloride, a fluoride, a bromide, an iodide, and a hydrate thereof each containing an M2 element can be used.

As the M3 source, an oxide, a hydroxide, a carbonate, a nitrate, a sulfate, a phosphate, a chloride, a fluoride, a bromide, an iodide, and a hydrate thereof each containing an M3 element can be used.

As the M4 source, an oxide, a hydroxide, a carbonate, a nitrate, a sulfate, a phosphate, a chloride, a fluoride, a bromide, an iodide, and a hydrate thereof each containing an M4 element can be used.

[Mixing Step]

The phosphor raw materials may be weighed in such a manner to obtain a target composition, sufficiently mixed using a ball mill or the like, filled in a container, and fired at a predetermined temperature under an atmosphere, and a fired product may be crushed and washed.

Specifically, the M1 source, the M2 source, the M3 source, and the M4 source may be weighed and mixed in such a manner that the molar ratio of the M1 to M4 elements matches the molar ratio in a target composition formula.

The mixing method is not particularly limited, and any of a dry mixing method and a wet mixing method may be used.

Examples of the dry mixing method include a ball mill.

Examples of the wet mixing method include a method of adding a solvent or a dispersion medium to the above-described phosphor raw materials, mixing using a mortar and a pestle, setting the mixture into a solution or slurry state, and drying by spray drying, heat drying, natural drying, or the like.

[Firing Step]

The resulting mixture is filled into a container made of a material less reactive with each phosphor material. The material of the container used at the time of firing is not particularly limited as long as an effect of the present invention is not impaired, and examples thereof include a container made of alumina.

The firing temperature may vary depending on other conditions such as pressure, and firing can usually be performed at a temperature of from 300° C. to 2,000° C. The highest temperature reached in the firing step is usually 300° C. or more, preferably 1,000° C. or more, and more preferably 1,300° C. or more, and usually 2,000° C. or less, and preferably 1,700° C. or less.

When the firing temperature is too high, a defect in the crystal structure is likely to be induced due to an atomic defect of a phosphor, and the emission characteristics tend to be significantly reduced, and when the firing temperature is too low, progress of a solid phase reaction tends to be slow, and formation of a target phase and grain growth may be difficult to proceed.

The pressure in the firing step varies depending on the firing temperature or the like, and is usually 0.01 MPa or more, and preferably 0.05 MPa or more, and is usually 200 MPa or less, and preferably 190 MPa or less.

The firing atmosphere in the firing step is any as long as a desired phosphor can be obtained, and specific examples thereof include an air atmosphere, a nitrogen atmosphere, and a reducing atmosphere containing hydrogen or carbon, and, among others, a reducing atmosphere is particularly preferable. The number of firings is any as long as a desired phosphor can be obtained, and after firing once, the resulting fired body may be crushed and then fired again, and the number of firings is not particularly limited. At the time of firing a plurality of times, the atmosphere of each firing may be different.

The firing time varies depending on the temperature and pressure at the time of firing, and is usually 1 minute or more, and preferably 30 minutes or more, and usually 72 hours or less, and preferably 12 hours or less. When the firing time is too short, particles do not grow, and therefore, a phosphor with favorable characteristics can not be obtained, and when the firing time is too long, volatilization of the constituting elements is promoted, and therefore a defect is induced in the crystal structure due to an atomic defect, and a phosphor having favorable properties can not be obtained.

[Washing Step]

The method of producing a phosphor may include a step (washing step) of washing a phosphor obtained by firing before dispersion and classification.

Impurities mainly composed of unreacted residues and unreacted fractions of raw materials used when synthesizing a phosphor tend to remain in the phosphor, and side reaction components and the like are generated in phosphor slurry.

In order to improve the characteristics, it is necessary to remove as much as possible unreacted residues and impurities generated at the time of firing. The method of washing is not particularly limited as long as impurities can be removed. The resulting phosphor can be washed with any liquid such as: an acid such as hydrochloric acid, hydrofluoric acid, nitric acid, acetic acid, or sulfuric acid; a water-soluble organic solvent; an alkaline solution; or a mixed solution thereof. A washing liquid may contain a reducing agent such as hydrogen peroxide, or a washing liquid may be heated and cooled, as long as the light emission characteristics are not significantly reduced.

The time for immersing a phosphor in a washing liquid varies depending on stirring conditions and the like, and is usually 10 minutes or more, and preferably 1 hour or more, and usually 72 hours or less, and preferably 48 hours or less. Washing may be performed a plurality of times, and the type and concentration of the washing liquid may be changed.

A phosphor can be manufactured by performing an operation of immersing and washing the phosphor in a washing step, and then filtering and drying. Washing with ethanol, acetone, methanol or the like may be included therebetween.

<5. Phosphor-Containing Composition>

The phosphor of the present invention can also be used as a mixture with a liquid medium. In particular, when the phosphor of the present invention is used for an application such as a light-emitting device, it is preferable to use the phosphor dispersed in a liquid medium.

[Phosphor]

The type of a phosphor in a phosphor-containing composition is not limited, and can be arbitrarily selected from the phosphors of the present invention. The phosphors may be used singly, or in any combination of two or more kinds thereof in any ratio. Furthermore, the composition may contain a phosphor other than the phosphor of the present invention as long as an effect of the phosphor of the present invention is not significantly impaired.

[Liquid Medium]

The liquid medium used for the composition is not particularly limited as long as the performance of a phosphor is not impaired in a target range. For example, any inorganic material and/or organic material can be used as long as such a material exhibits liquid properties under a desired condition of use, suitably disperses the phosphor of the present invention, and does not cause any undesirable reaction, and examples thereof include a silicone resin, an epoxy resin, and a polyimide silicone resin.

[Content of Liquid Medium and Phosphor]

The contents of the phosphor and the liquid medium in the composition are any as long as an effect of the phosphor of the present invention is not significantly impaired, and the content of the liquid medium, based on the whole composition, is usually 30% by weight or more, and preferably 50% by weight or more, and usually 99% by weight or less, and preferably 95% by weight or less.

[Another Component]

The composition may contain another component in addition to the phosphor and the liquid medium, as long as an effect of the phosphor of the present invention is not significantly impaired. The other components may be used singly, or in any combination of two or more kinds thereof in any ratio.

EXAMPLES

Hereinafter, the present invention will be specifically described by way of Examples, but the present invention is not limited thereto without departing from the scope of the present invention.

Values of various manufacturing conditions and evaluation results in the following Examples have meanings as preferable values of upper limit and lower limit in the embodiments of the present invention, and a preferable range may be a range defined by a combination of the value of the upper limit or the lower limit and the value of the following Example or a combination of the values of the Examples.

{Measurement Method}

[Emission Spectrum]

The emission spectrum was measured using a fluorescence spectrophotometer F-7000 (manufactured by Hitachi, Ltd.). More specifically, excitation light with a wavelength of 455 nm was irradiated at room temperature (25° C.), and an emission spectrum within a wavelength range of from 500 nm to 900 nm was obtained. The emission peak wavelength (hereinafter, sometimes referred to as "peak wavelength") was read from the obtained emission spectrum.

[Excitation Spectrum]

The excitation spectrum was measured using a fluorescence spectrophotometer F-7000 (manufactured by Hitachi, Ltd.). More specifically, the emission peak was monitored at room temperature (25° C.), and an excitation spectrum within a wavelength range of from 300 nm to 750 nm was obtained.

[Powder X-Ray Diffraction Measurement]

Powder X-ray diffraction was precisely measured with a powder X-ray diffractometer D8 ADVANCE ECO (manufactured by Bruker Corporation). The measurement conditions are as follows.

using Cu-K α tube
X-ray output=40 kV, 25 mA
Divergence slit=automatic
Detector=Semiconductor array detector LYNXEYE, using Cu filter
Scanning range 2θ=from 5 to 70 degrees
Reading width=0.025 degrees

[Afterglow Time]

Using a fluorescence spectrophotometer F-7000 (manufactured by Hitachi, Ltd.), excitation light with a wavelength of 455 nm was irradiated once at room temperature (25° C.), and the intensity change of the emission peak after the irradiation was stopped was measured. The initial intensity was 1.0, and the time taken for the intensity to fall to $\frac{1}{10}$ the initial intensity was set to the afterglow time.

[Reflectance]

Measurement of the reflectance was performed using a spectrophotometer U-3310 (manufactured by Hitachi, Ltd.). More specifically, $BaSO_4$ particles and the phosphor particles of Examples were respectively spread in quartz cells. The reflectance of the phosphor particles of Examples was measured as a relative value to the reflectance of $BaSO_4$ particles in a wavelength range of from 300 nm to 900 nm, using $BaSO_4$ particles as a reference sample.

{Manufacture of Phosphor}

Example 1

As raw materials, commercially available $CaCO_3$ powder (8071073 manufactured by Hakushin Chemical Laboratory Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), and $Cr_2O_3$ powder (B58840N manufactured by KISHIDA CHEMICAL Co., Ltd.) were weighed in such a manner that a phosphor obtained after synthesis was $Ca_{1.0}Ga_{6.0}Al_{5.88}Cr_{0.12}O_{19}$.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 1 was obtained.

The excitation and emission spectra of the phosphor of Example 1 are shown in FIG. 1. The emission peak wavelength of the phosphor of Example 1 was 773 nm, and the half width of the emission peak wavelength was 170 nm. In FIG. 1, the solid line shows the emission spectrum when irradiated with excitation light of wavelength 455 nm, and the dotted line shows the excitation spectrum for the emission peak wavelength of 773 nm. From the above, it can be seen that the phosphor of Example 1 emits light in a wide range of infrared region by excitation of visible light. The phosphor of Example 1 was once irradiated with excitation light of wavelength 455 nm, and after the irradiation was stopped, the emission intensity change at the emission peak wavelength of 773 nm was measured, and as a result, the afterglow time to fall to $\frac{1}{10}$ of the initial intensity was 4 ms.

Figure 2:
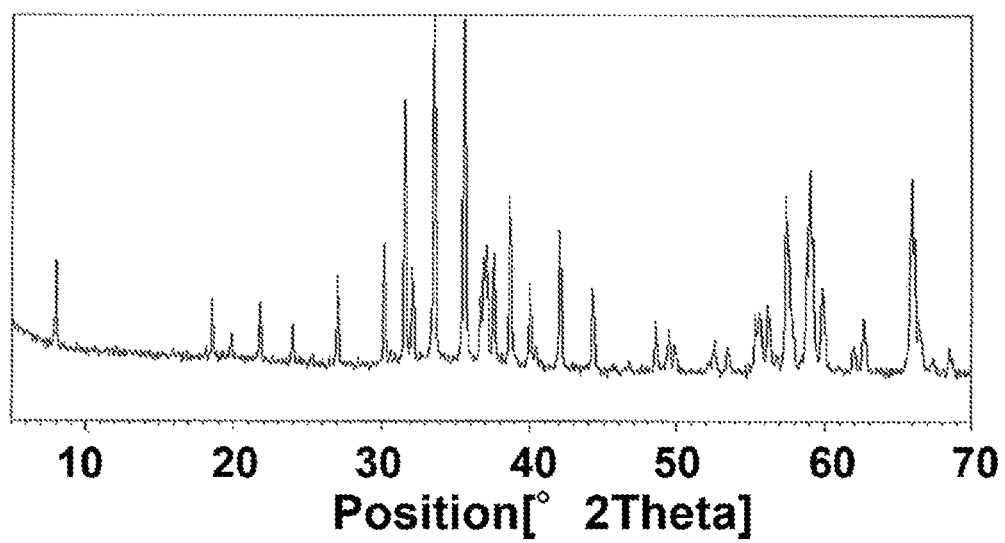
FIG. 2 shows an XRD pattern of a phosphor of Example 1.

An XRD pattern obtained by performing powder X-ray diffraction measurement on the phosphor of Example 1 is shown in FIG. 2. It can be seen that the phosphor of Example 1 is composed of single phase Ca $(Al,Ga)_{12}O_{19}$.

Example 2

As raw materials, commercially available $CaCO_3$ powder (8071073 manufactured by Hakushin Chemical Laboratory Co., Ltd.), $K_2CO_3$ powder (STE4006 manufactured by Wako Pure Chemical Industries, Ltd.), $Tm_2O_3$ powder (TM-04-001 manufactured by Shin-Etsu Chemical Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), and $Cr_2O_3$ powder (B58840N manufactured by KISHIDA CHEMICAL Co., Ltd.) were weighed in such a manner that a phosphor obtained after synthesis was $Ca_{0.98}Tm_{0.01}K_{0.01}Ga_{6.0}Al_{5.88}Cr_{0.12}O_{19}$.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, the resultant was placed in an alumina container, the container was placed in a small electric furnace, and heated again at 1,500° C. in the atmosphere for 10 hours, and a fired body was obtained. The fired body was crushed in an alumina mortar until there were no large lumps, and a phosphor of Example 2 was obtained.

Figure 3:
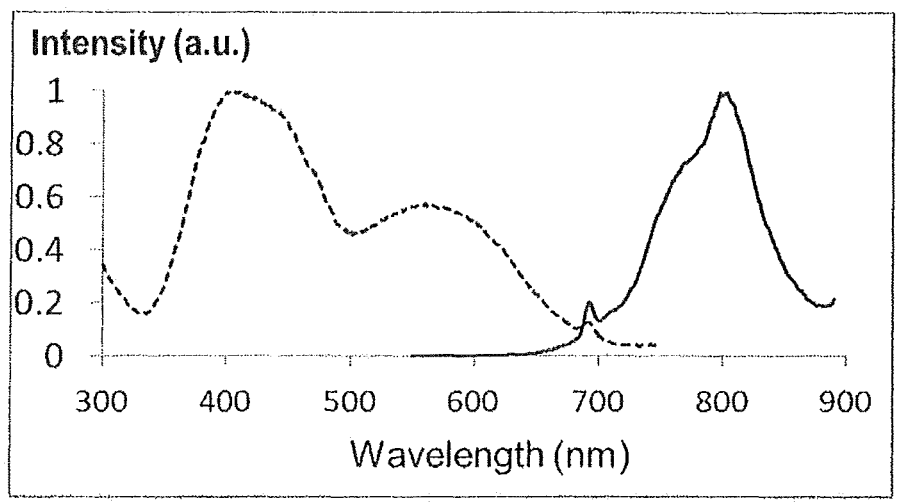
FIG. 3 shows excitation and emission spectra of a phosphor of Example 2.

The excitation and emission spectra of the phosphor of Example 2 are shown in FIG. 3. The emission peak wavelength of the phosphor of Example 2 was 803 nm, and the half width of the emission peak wavelength was 89 nm. In FIG. 3, the solid line shows the emission spectrum when irradiated with excitation light of wavelength 455 nm, and the dotted line shows the excitation spectrum for the emission peak wavelength of 803 nm. From the above, it can be seen that the phosphor can be excited over a wide range of visible light.

The phosphor of Example 2 was once irradiated with excitation light of wavelength 455 nm, and after the irradiation was stopped, the emission intensity change at the emission peak wavelength of 803 nm was measured, and as a result, the afterglow time to fall to $\frac{1}{10}$ of the initial intensity was 4 ms.

Figure 4:
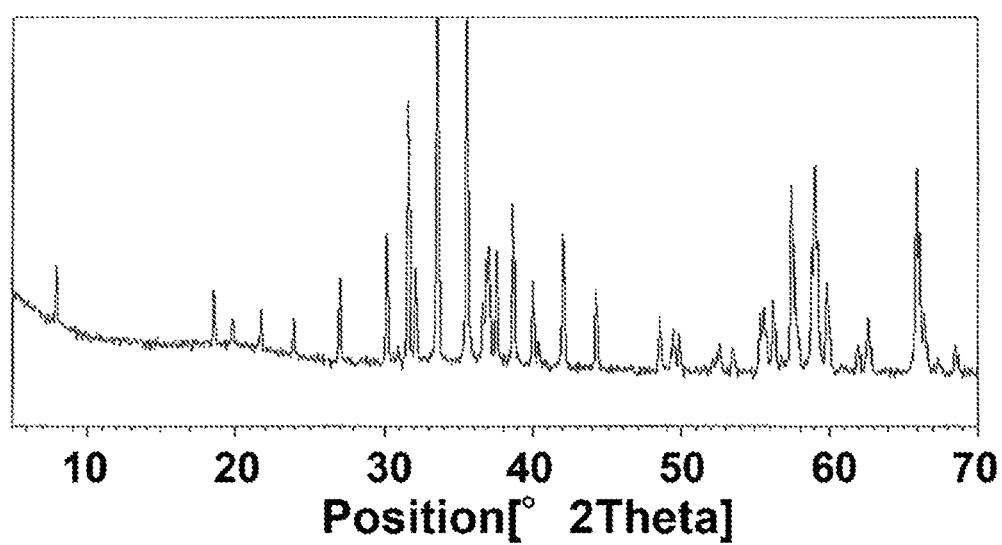
FIG. 4 shows an XRD pattern of a phosphor of Example 2.

An XRD pattern obtained by performing powder X-ray diffraction measurement on the phosphor of Example 2 is shown in FIG. 4. It can be seen that the phosphor of Example 2 is composed of single phase Ca $(Al,Ga)_{12}O_{19}$.

Example 3

As raw materials, commercially available $SrCO_3$ powder (307134 manufactured by Hakushin Chemical Laboratory Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), and $Cr_2O_3$ powder (B58840N manufactured by KISHIDA CHEMICAL Co., Ltd.) were weighed in such a manner that a phosphor obtained after synthesis was $Sr_{1.0}Ga_{9.0}Al_{2.88}Cr_{0.12}O_{19}$.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,450° C. in the atmosphere for 8 hours, and a fired body was obtained. The fired body was crushed in an alumina mortar until there were no large lumps, and a phosphor of Example 3 was obtained.

Figure 5:
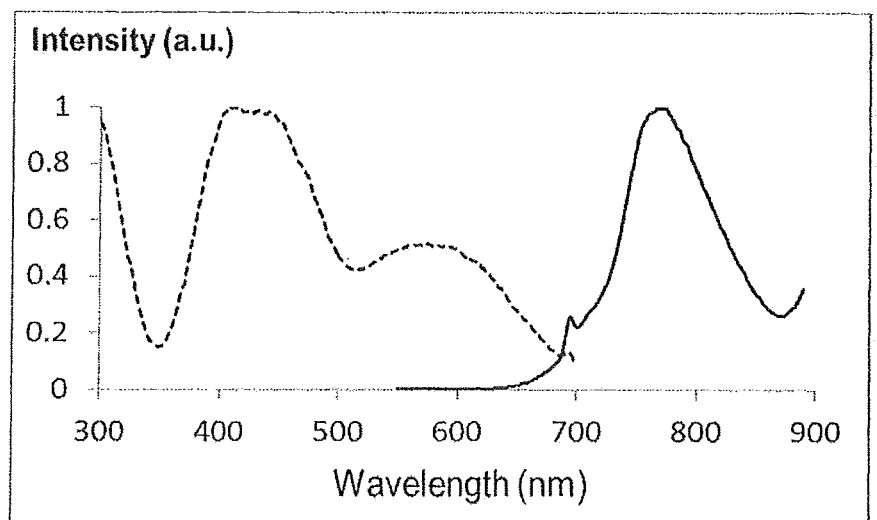
FIG. 5 shows excitation and emission spectra of a phosphor of Example 3.

The excitation and emission spectra of the phosphor of Example 3 are shown in FIG. 5. The emission peak wavelength of the phosphor of Example 3 was 772 nm, and the half width of the emission peak wavelength was 94 nm. In FIG. 5, the solid line shows the emission spectrum when irradiated with excitation light of wavelength 455 nm, and the dotted line shows the excitation spectrum for the emission peak wavelength of 772 nm. From the above, it can be seen that the phosphor can be excited over a wide range of visible light.

Figure 6:
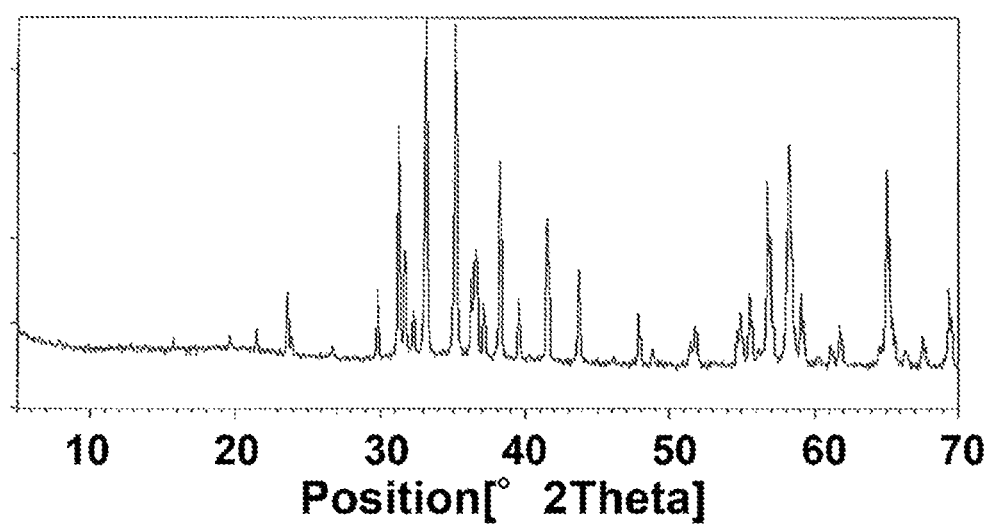
FIG. 6 shows an XRD pattern of a phosphor of Example 3.

An XRD pattern obtained by performing powder X-ray diffraction measurement on the phosphor of Example 3 is shown in FIG. 6. It can be seen that the phosphor of Example 3 is composed of single phase $SrGa_9Al_3O_{19}$.

Example 4

A phosphor of Example 4 was obtained in the same manner as in Example 3 except that the composition of a phosphor obtained after synthesis was $Sr_{1.0}Ga_{6.0}Al_{5.88}Cr_{0.12}O_{19}$.

Figure 7:
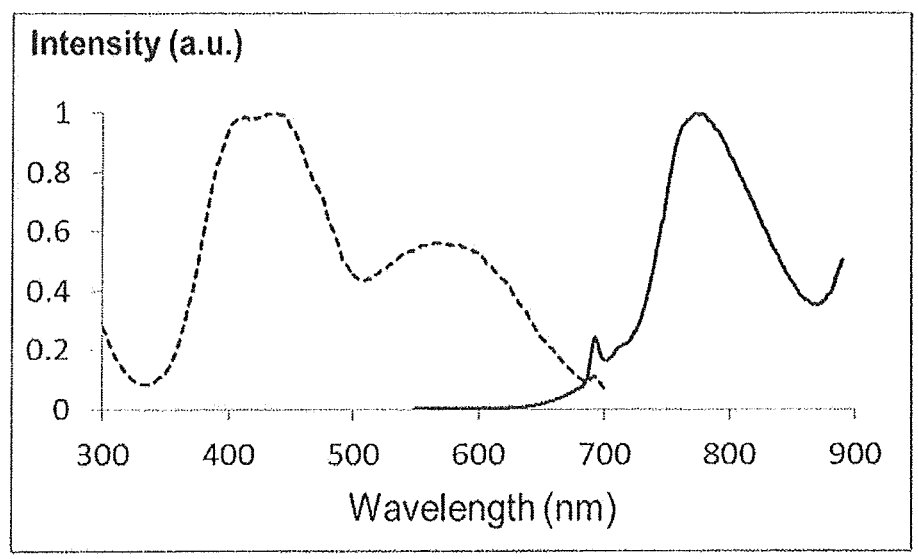
FIG. 7 shows excitation and emission spectra of a phosphor of Example 4.

The excitation and emission spectra of the phosphor of Example 4 are shown in FIG. 7. The emission peak wavelength of the phosphor of Example 4 was 774 nm, and the half width of the emission peak wavelength was 100 nm. In FIG. 7, the solid line shows the emission spectrum when irradiated with excitation light of wavelength 455 nm, and the dotted line shows the excitation spectrum for the emission peak wavelength of 774 nm. From the above, it can be seen that the phosphor can be excited over a wide range of visible light.

The phosphor of Example 4 was once irradiated with excitation light of wavelength 455 nm, and after the irradiation was stopped, the emission intensity change at the emission peak wavelength of 774 nm was measured, and as a result, the afterglow time to fall to 1/10 of the initial intensity was 4 ms.

Figure 8:
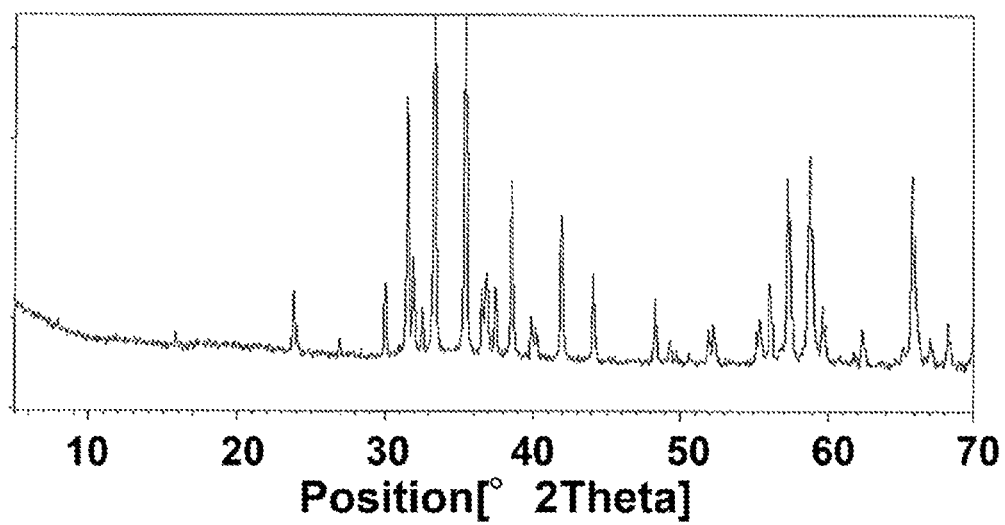
FIG. 8 shows an XRD pattern of a phosphor of Example 4.

An XRD pattern obtained by performing powder X-ray diffraction measurement on the phosphor of Example 4 is shown in FIG. 8. It can be seen that the phosphor of Example 4 is composed of single phase $SrGa_6Al_6O_{19}$.

Example 5

As raw materials, commercially available $SrCO_3$ powder (20820-61H-S manufactured by RARE METALLIC Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), and $Cr_2O_3$ powder (B58840N manufactured by KISHIDA CHEMICAL Co., Ltd.) were weighed in such a manner that a phosphor obtained after synthesis was $Sr_{1.0}Ga_{1.0}Al_{10.88}Cr_{0.12}O_{19}$, and in order to promote crystal growth, 0.5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 5 was obtained.

Figure 9:
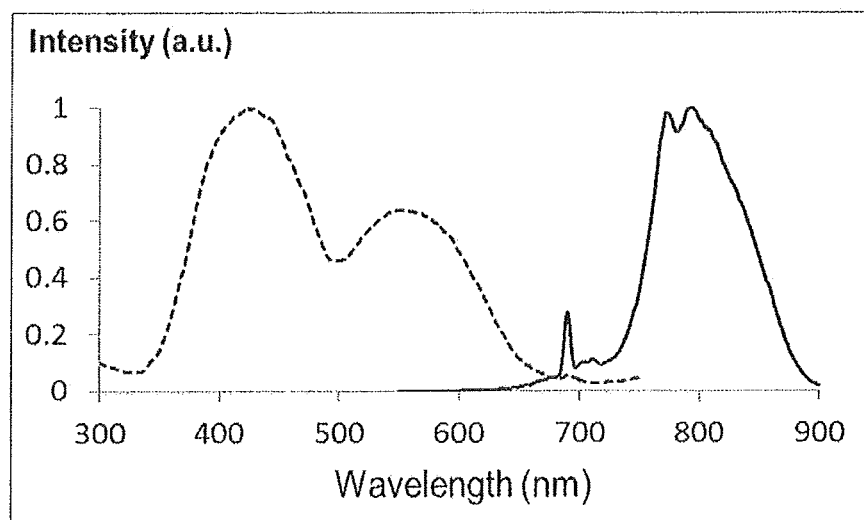
FIG. 9 shows excitation and emission spectra of a phosphor of Example 5.

The excitation and emission spectra of the phosphor of Example 5 are shown in FIG. 9. The emission peak wavelength of the phosphor of Example 5 was 793 nm, and the half width of the emission peak wavelength was 92 nm. In FIG. 9, the solid line shows the emission spectrum when irradiated with excitation light of wavelength 455 nm, and the dotted line shows the excitation spectrum for the emission peak wavelength of 793 nm. From the above, it can be seen that the phosphor can be excited over a wide range of visible light.

Figure 10:
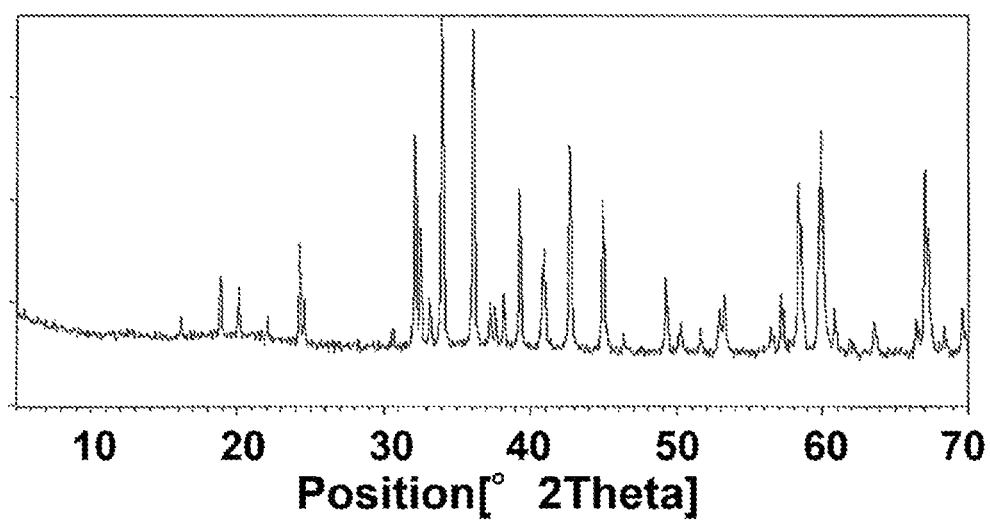
FIG. 10 shows an XRD pattern of a phosphor of Example 5.

An XRD pattern obtained by performing powder X-ray diffraction measurement on the phosphor of Example 5 is shown in FIG. 10. It can be seen that the phosphor of Example 5 is composed of single phase $SrGaAl_{11}O_{19}$.

Example 6

As raw materials, commercially available $SrCO_3$ powder (307134 manufactured by Hakushin Chemical Laboratory Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), and $Cr_2O_3$ powder (B58840N manufactured by KISHIDA CHEMICAL Co., Ltd.) were weighed in such a manner that a phosphor obtained after synthesis was $Sr_{1.0}Ga_{2.0}Al_{9.00}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,450° C. in the atmosphere for 8 hours, and a fired body was obtained. The fired body was crushed in an alumina mortar until there were no large lumps, and a phosphor of Example 6 was obtained.

Figure 11:
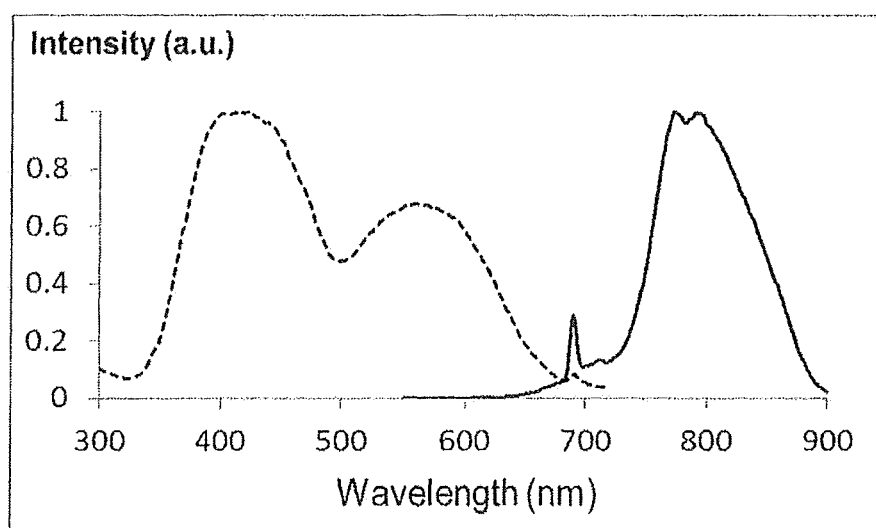
FIG. 11 shows excitation and emission spectra of a phosphor of Example 6.

The excitation and emission spectra of the phosphor of Example 6 are shown in FIG. 11. The emission peak wavelength of the phosphor of Example 6 was 774 nm, and the half width of the emission peak wavelength was 96 nm. In FIG. 11, the solid line shows the emission spectrum when irradiated with excitation light of wavelength 455 nm, and the dotted line shows the excitation spectrum for the emission peak wavelength of 774 nm. From the above, it can be seen that the phosphor can be excited over a wide range of visible light.

The phosphor of Example 6 was once irradiated with excitation light of wavelength 455 nm, and after the irradiation was stopped, the emission intensity change at the emission peak wavelength of 774 nm was measured, and as a result, the afterglow time to fall to 1/10 of the initial intensity was 5 ms.

Figure 12:
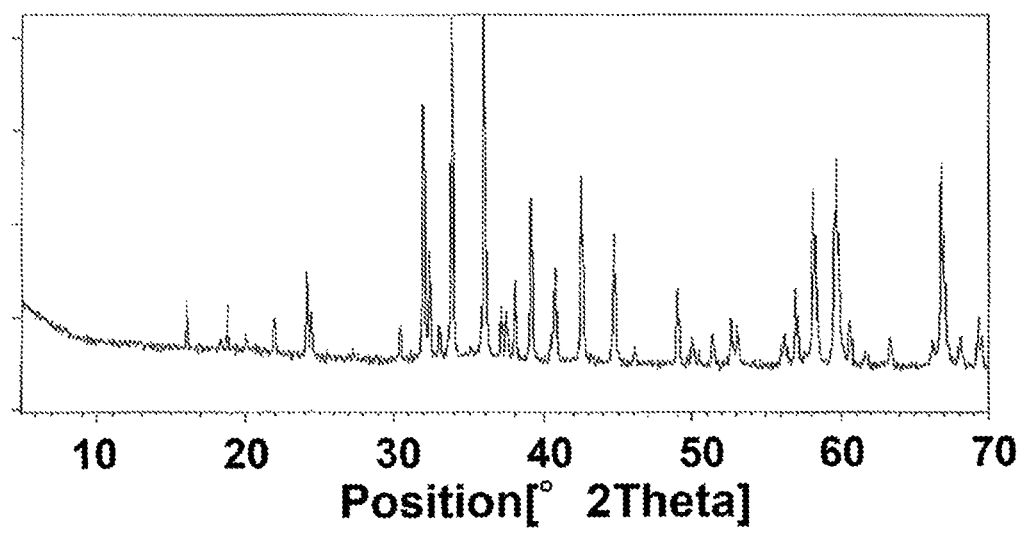
FIG. 12 shows an XRD pattern of a phosphor of Example 6.

An XRD pattern obtained by performing powder X-ray diffraction measurement on the phosphor of Example 6 is shown in FIG. 12. It can be seen that the phosphor of Example 6 is composed of $SrGa_2Al_{10}O_{19}$ as a main phase.

Example 7

A phosphor of Example 7 was obtained in the same manner as in Example 6 except that commercially available $SrCO_3$ powder (307134 manufactured by Hakushin Chemical Laboratory Co., Ltd.), $Al_2O_3$ powder (Sumitomo Chemical Co., Ltd. AKP-20), $Ga_2O_3$ powder (90402 manufactured by MITSUI MINING & SMELTING CO., LTD.), $Cr_2O_3$ powder (B58840N manufactured by KISHIDA CHEMICAL Co., Ltd.), $K_2CO_3$ powder (STE4006 manufactured by Wako Pure Chemical Industries, Ltd.), and $Tm_2O_3$ powder (TM-04-001 manufactured by Shin-Etsu Chemical Co., Ltd.) were used as raw materials in such a manner that a phosphor obtained after synthesis was $Sr_{0.98}Tm_{0.01}K_{0.01}Ga_{2.0}Al_{9.88}Cr_{0.12}O_{19}$.

Figure 13:
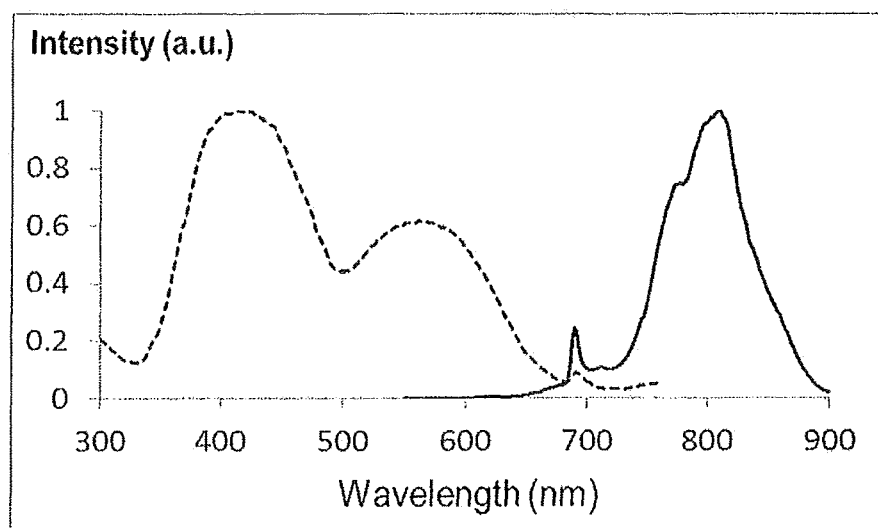
FIG. 13 shows excitation and emission spectra of a phosphor of Example 7.

The excitation and emission spectra of the phosphor of Example 7 are shown in FIG. 13. The emission peak wavelength of the phosphor of Example 7 was 810 nm, and the half width of the emission peak wavelength was 79 nm. In FIG. 13, the solid line shows the emission spectrum when irradiated with excitation light of wavelength 455 nm, and the dotted line shows the excitation spectrum for the emission peak wavelength of 810 nm. From the above, it can be seen that the phosphor can be excited over a wide range of visible light.

Figure 14:
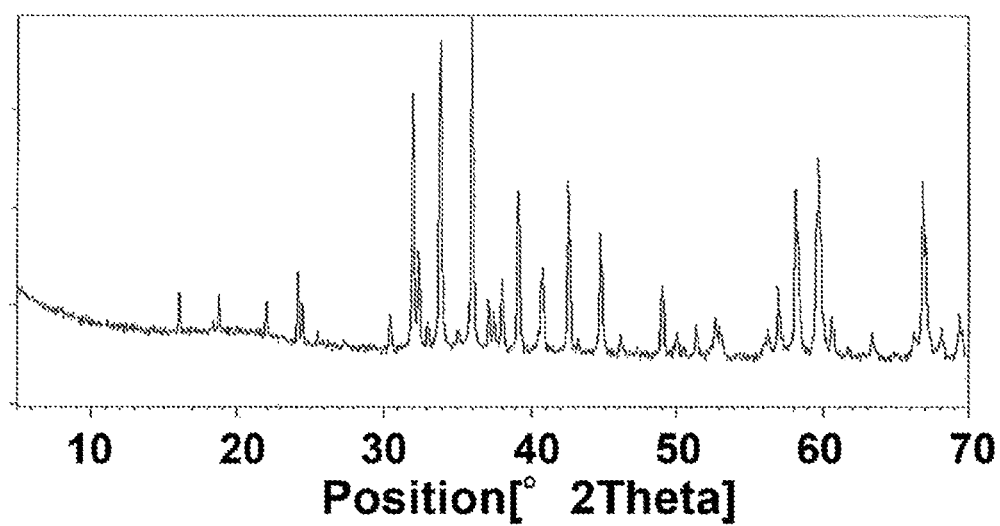
FIG. 14 shows an XRD pattern of a phosphor of Example 7.

An XRD pattern obtained by performing powder X-ray diffraction measurement on the phosphor of Example 7 is shown in FIG. 14. It can be seen that the phosphor of Example 7 is composed of $SrGa_2Al_{10}O_{19}$ as a main phase.

Example 8

A phosphor of Example 8 was obtained in the same manner as in Example 7 except that a phosphor obtained after synthesis was $Sr_{0.90}Tm_{0.05}K_{0.05}Ga_{2.0}Al_{9.88}Cr_{0.12}O_{19}$.

Figure 15:
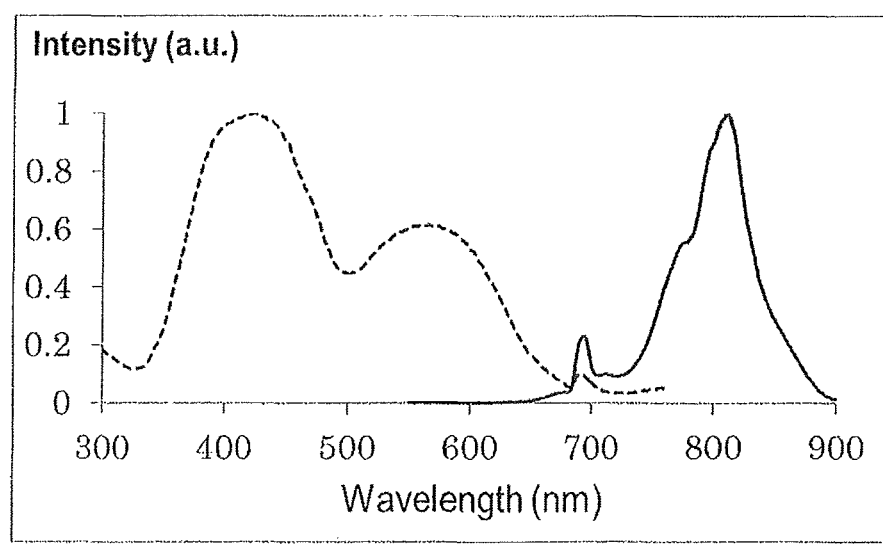
FIG. 15 shows excitation and emission spectra of a phosphor of Example 8.

The excitation and emission spectra of the phosphor of Example 8 are shown in FIG. 15. The emission peak wavelength of the phosphor of Example 8 was 810 nm, and the half width of the emission peak wavelength was 64 nm. In FIG. 15, the solid line shows the emission spectrum when irradiated with excitation light of wavelength 455 nm, and the dotted line shows the excitation spectrum for the emission peak wavelength of 772 nm. From the above, it can be seen that the phosphor can be excited over a wide range of visible light.

The phosphor of Example 8 was once irradiated with excitation light of wavelength 455 nm, and after the irradiation was stopped, the emission intensity change at the emission peak wavelength of 810 nm was measured, and as a result, the afterglow time to fall to 1/10 of the initial intensity was 4 ms.

Figure 16:
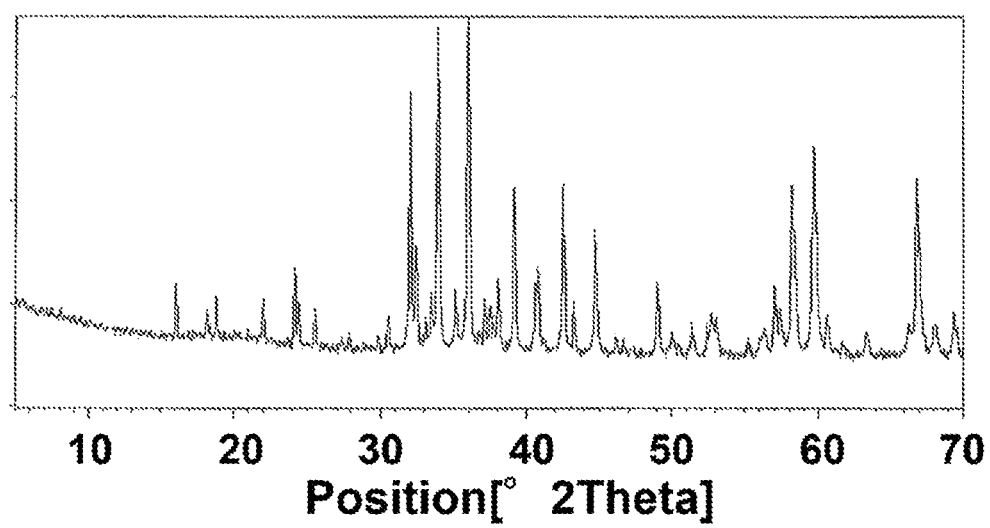
FIG. 16 shows an XRD pattern of a phosphor of Example 8.

An XRD pattern obtained by performing powder X-ray diffraction measurement on the phosphor of Example 8 is shown in FIG. 16. It can be seen that the phosphor of Example 8 is composed of $SrGa_2Al_{10}O_{19}$ as a main phase.

Example 9

As raw materials, commercially available commercially available $CaCO_3$ powder (8071073 manufactured by Hakushin Chemical Laboratory Co., Ltd.), MgO powder (LKG5947 manufactured by Wako Pure Chemical Industries, Ltd.), $Tm_2O_3$ powder (TM-04-001 manufactured by Shin-Etsu Chemical Co., Ltd.), $Al_2O_3$ powder (AKP-20 manufactured by Sumitomo Chemical Co., Ltd.), and $Cr_2O_3$ powder (B58840N manufactured by KISHIDA CHEMICAL Co., Ltd.) were weighed in such a manner that a phosphor obtained after synthesis was $Ca_{0.99}Tm_{0.01}Mg_{0.01}Al_{11.87}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 9 was obtained.

Figure 17:
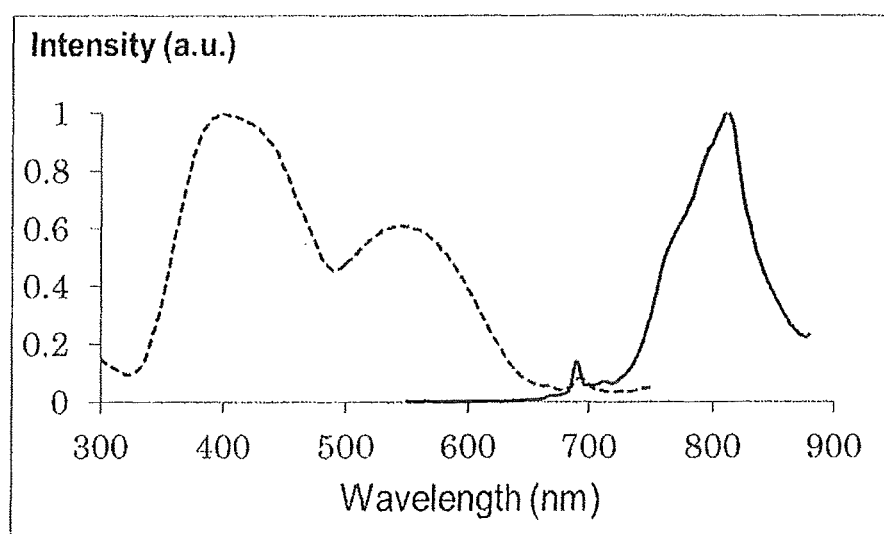
FIG. 17 shows excitation and emission spectra of a phosphor of Example 9.

The excitation and emission spectra of the phosphor of Example 9 are shown in FIG. 17. The emission peak wavelength of the phosphor of Example 9 was 812 nm, and the half width of the emission peak wavelength was 74 nm. In FIG. 17, the solid line shows the emission spectrum when irradiated with excitation light of wavelength 455 nm, and the dotted line shows the excitation spectrum for the emission peak wavelength of 812 nm. From the above, it can be seen that the phosphor can be excited over a wide range of visible light.

The phosphor of Example 9 was once irradiated with excitation light of wavelength 455 nm, and after the irradiation was stopped, the emission intensity change at the emission peak wavelength of 812 nm was measured, and as a result, the afterglow time to fall to 1/10 of the initial intensity was 5 ms.

Figure 18:
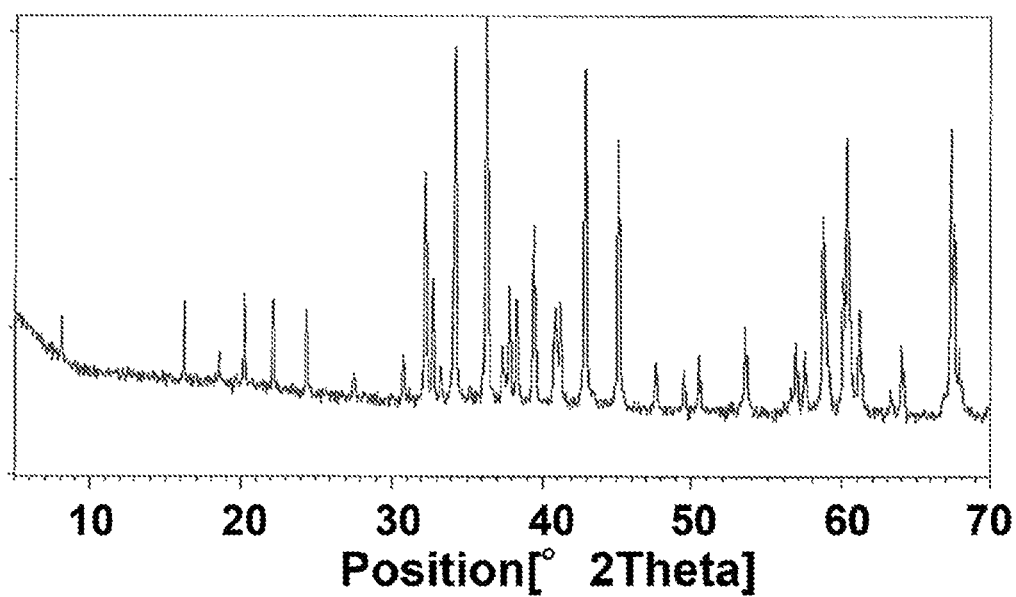
FIG. 18 shows an XRD pattern of a phosphor of Example 9.

An XRD pattern obtained by performing powder X-ray diffraction measurement on the phosphor of Example 9 is shown in FIG. 18. It can be seen that the phosphor of Example 9 is composed of $CaAl_{12}O_{19}$ as a main phase.

Example 10

Commercially available $SrCO_3$ powder (20820-61H-S manufactured by RARE METALLIC Co., Ltd.), $K_2CO_3$ powder (STE4006 manufactured by Wako Pure Chemical Industries, Ltd.), $Tm_2O_3$ powder (T-04-001 manufactured by Shin-Etsu Chemical Co., Ltd.), $Al_2O_3$ powder (AKP-20 manufactured by Sumitomo Chemical Co., Ltd.), and $Cr_2O_3$ powder (B58840N manufactured by KISHIDA CHEMICAL Co., Ltd.) were weighed in such a manner that a phosphor obtained after synthesis was $Sr_{0.98}Tm_{0.01}K_{0.01}Al_{11.88}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 10 was obtained.

Figure 19:
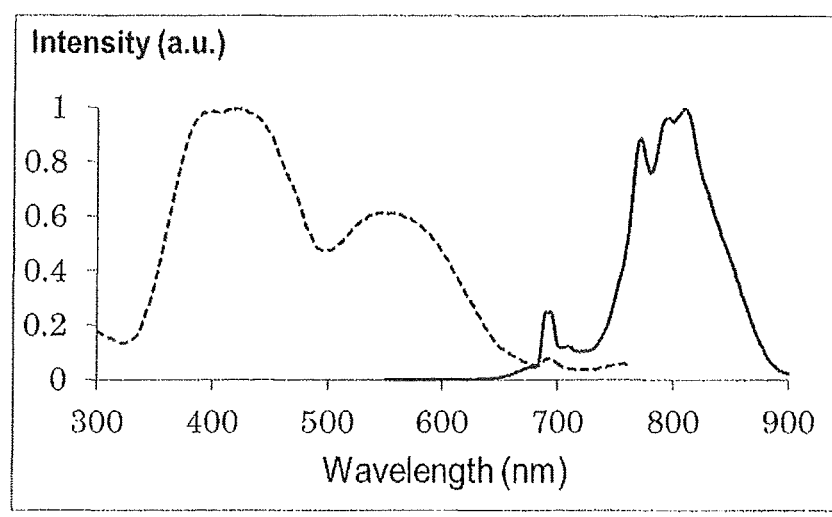
FIG. 19 shows excitation and emission spectra of a phosphor of Example 10.

The excitation and emission spectra of the phosphor of Example 10 are shown in FIG. 19. The emission peak wavelength of the phosphor of Example 10 was 810 nm, and the half width of the emission peak wavelength was 83 nm. In FIG. 19, the solid line shows the emission spectrum when irradiated with excitation light of wavelength 455 nm, and the dotted line shows the excitation spectrum for the emission peak wavelength of 810 nm. From the above, it can be seen that the phosphor can be excited over a wide range of visible light.

The phosphor of Example 10 was once irradiated with excitation light of wavelength 455 nm, and after the irradiation was stopped, the emission intensity change at the emission peak wavelength of 812 nm was measured, and as a result, the afterglow time to fall to 1/10 of the initial intensity was 5 ms.

Figure 20:
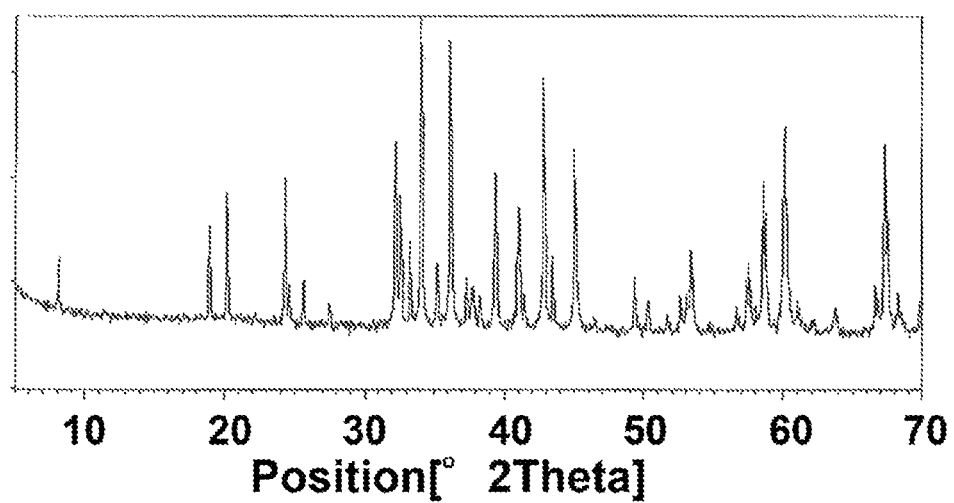
FIG. 20 shows an XRD pattern of a phosphor of Example 10.

An XRD pattern obtained by performing powder X-ray diffraction measurement on the phosphor of Example 10 is shown in FIG. 20. It can be seen that the phosphor of Example 10 is composed of $SrAl_{12}O_{19}$ as a main phase.

Example 11

As raw materials, commercially available $CaCO_3$ powder (8071073 manufactured by Hakushin Chemical Laboratory Co., Ltd.), $Al_2O_3$ powder (AKP-20 manufactured by Sumitomo Chemical Co., Ltd.), and $Cr_2O_3$ powder (B58840N manufactured by KISHIDA CHEMICAL Co., Ltd.) were weighed in such a manner that a phosphor obtained after synthesis was $CaAl_{11.88}Cr_{0.12}O_{19}$, and in order to promote crystal growth, 1% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 11 was obtained.

Figure 21:
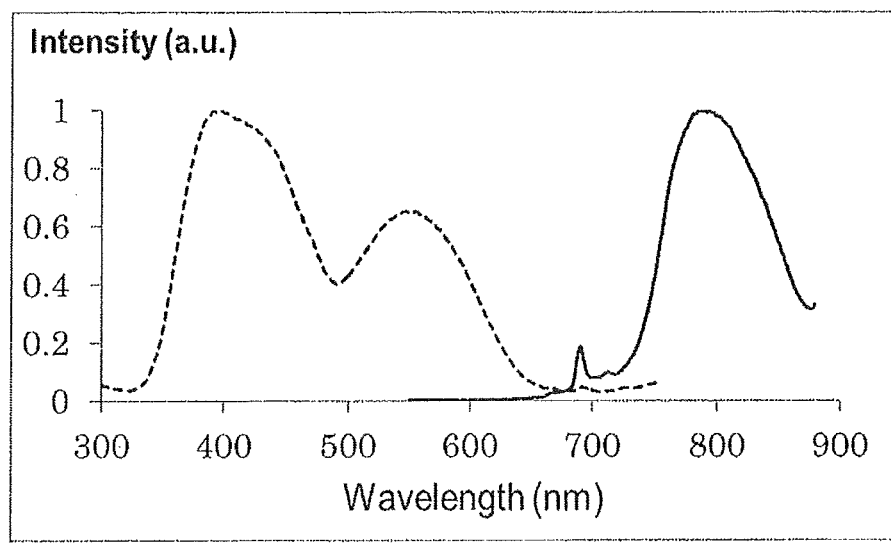
FIG. 21 shows excitation and emission spectra of a phosphor of Example 11.

The excitation and emission spectra of the phosphor of Example 11 are shown in FIG. 21. The emission peak wavelength of the phosphor of Example 11 was 786 nm, and the half width of the emission peak wavelength was 81 nm. In FIG. 21, the solid line shows the emission spectrum when irradiated with excitation light of wavelength 455 nm, and the dotted line shows the excitation spectrum for the emission peak wavelength of 786 nm. From the above, it can be seen that the phosphor can be excited over a wide range of visible light.

The phosphor of Example 11 was once irradiated with excitation light of wavelength 455 nm, and after the irradiation was stopped, the emission intensity change at the emission peak wavelength of 786 nm was measured, and as a result, the afterglow time to fall to $\frac{1}{10}$ of the initial intensity was 5 ms.

Figure 22:
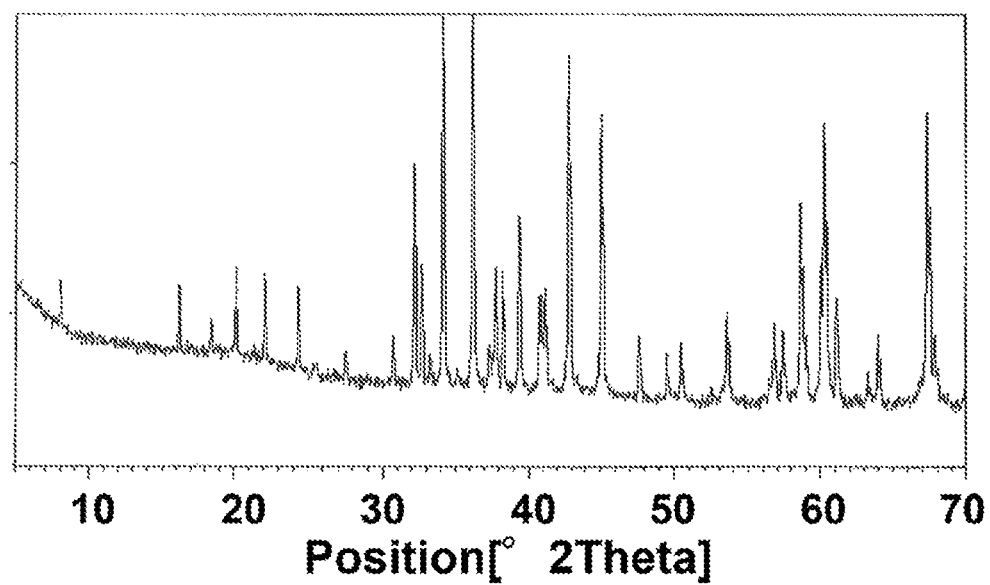
FIG. 22 shows an XRD pattern of a phosphor of Example 11.

An XRD pattern obtained by performing powder X-ray diffraction measurement on the phosphor of Example 11 is shown in FIG. 22. It can be seen that the phosphor of Example 11 is composed of $CaAl_{12}O_{19}$ as a main phase.

Example 12

Commercially available $SrCO_3$ powder (307134 manufactured by Hakushin Chemical Laboratory Co., Ltd.), $Al_2O_3$ powder (γ-alumina manufactured by Kojundo Chemical Laboratory Co., Ltd.), and $Cr_2O_3$ powder (B58840N manufactured by KISHIDA CHEMICAL Co., Ltd.) were weighed in such a manner that a phosphor obtained after synthesis was $SrAl_{11.88}Cr_{0.12}O_{19}$, and in order to promote crystal growth, 1% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,650° C. in the atmosphere for 8 hours, and a fired body was obtained. The fired body was crushed in an alumina mortar until there were no large lumps, and a phosphor of Example 12 was obtained.

Figure 23:
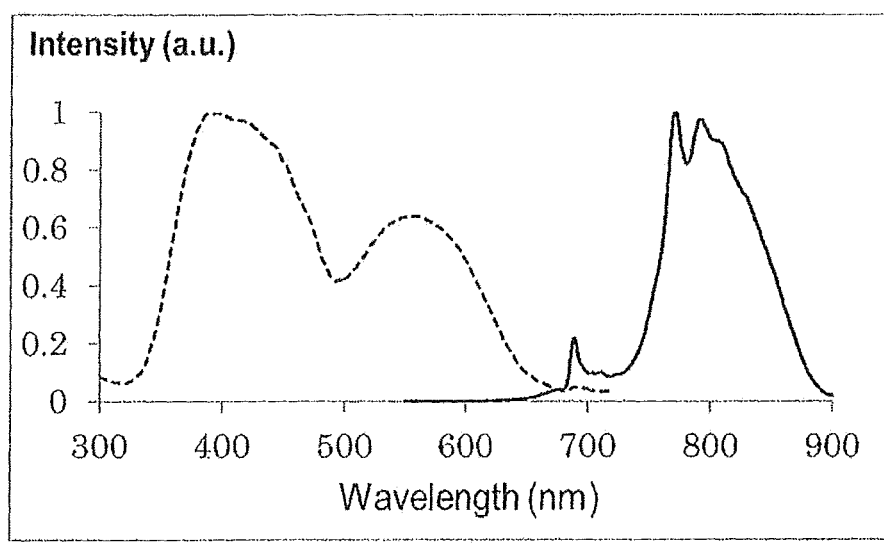
FIG. 23 shows excitation and emission spectra of a phosphor of Example 12.

The excitation and emission spectra of the phosphor of Example 12 are shown in FIG. 23. The emission peak wavelength of the phosphor of Example 12 was 771 nm, and the half width of the emission peak wavelength was 87 nm. In FIG. 23, the solid line shows the emission spectrum when irradiated with excitation light of wavelength 455 nm, and the dotted line shows the excitation spectrum for the emission peak wavelength of 771 nm. From the above, it can be seen that the phosphor can be excited over a wide range of visible light.

The phosphor of Example 12 was once irradiated with excitation light of wavelength 455 nm, and after the irradiation was stopped, the emission intensity change at the emission peak wavelength of 771 nm was measured, and as a result, the afterglow time to fall to $\frac{1}{10}$ of the initial intensity was 5 ms.

Figure 24:
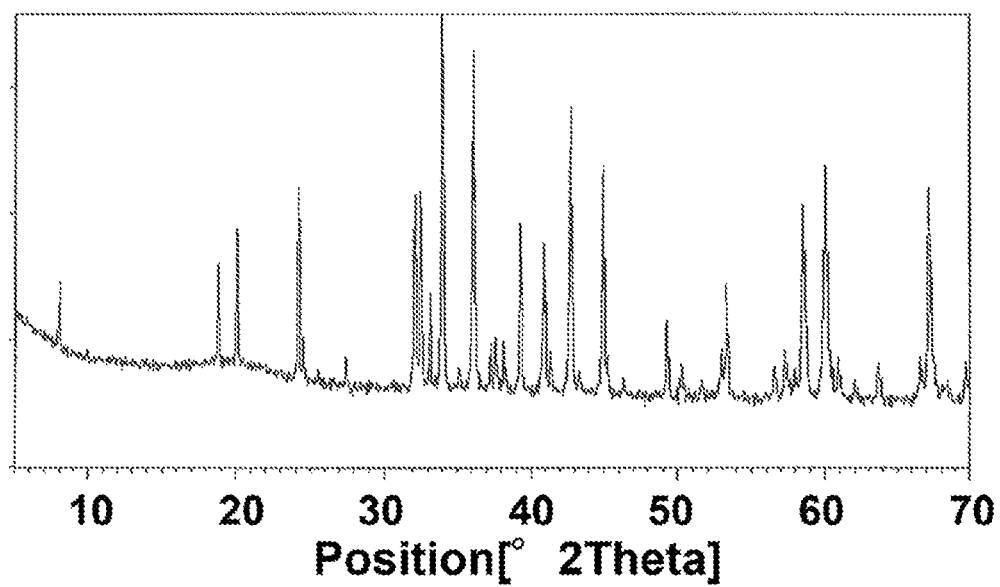
FIG. 24 shows an XRD pattern of a phosphor of Example 12.

An XRD pattern obtained by performing powder X-ray diffraction measurement on the phosphor of Example 12 is shown in FIG. 24. It can be seen that the phosphor of Example 12 is composed of $SrAl_{12}O_{19}$ as a main phase.

For the phosphors of Examples 1 to 10, the reflectance in the wavelength range of from 300 to 850 nm was measured, and the reflectance minimum value R1 in the wavelength range of from 700 to 850 nm, the reflectance minimum value R2 in the wavelength range of from 300 to 700 nm, and the difference R1-R2 of the reflectance minimum values are shown in Table 1. From Table 1, the phosphors of the respective Examples had high reflectance in the emission wavelength range of from 700 to 850 nm and low reflectance in the wavelength range of from 300 to 700 nm in which visible light is included, and therefore, it can be seen that, while visible light is efficiently absorbed, the absorption is small in the emission wavelength range.

Figure 25:
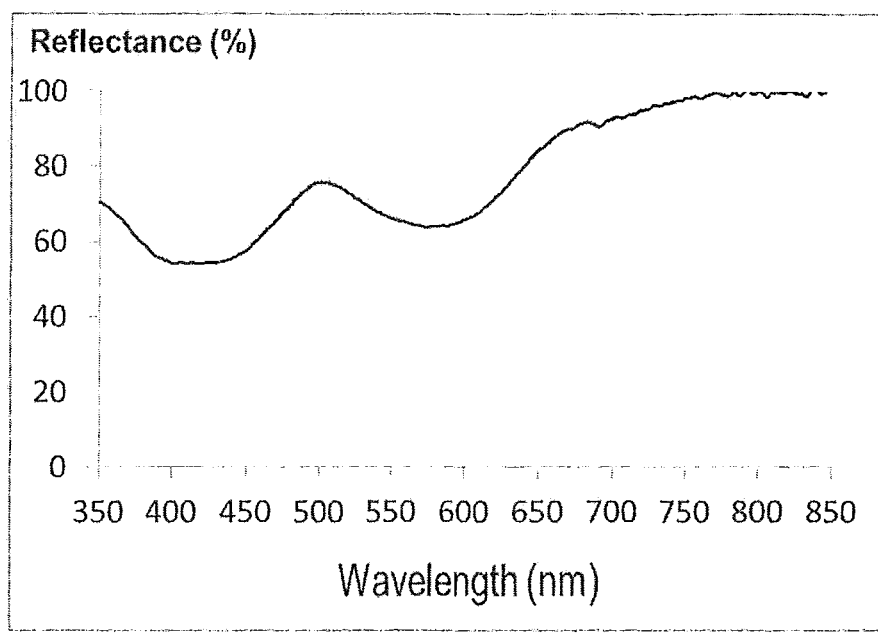
FIG. 25 shows the reflectance spectrum of the phosphor of Example 1.
Figure 26:
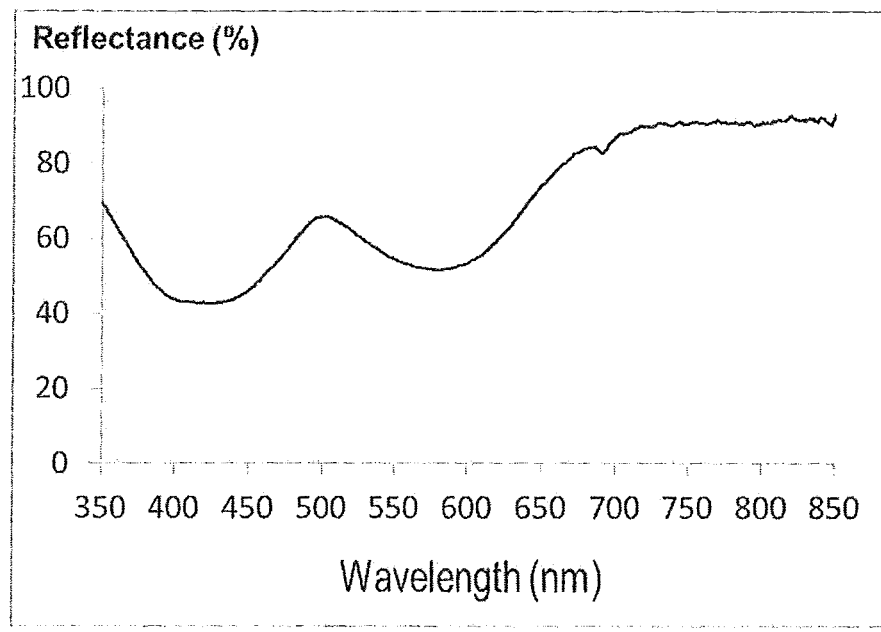
FIG. 26 shows the reflectance spectrum of the phosphor of Example 2.

Reflectance spectra of the phosphors of Example 1 and Example 2 are shown in FIGS. 25 and 26, respectively. It can be seen that the reflectance in the emission wavelength range of from 700 to 850 nm was high, and the reflectance in the wavelength range of from 300 to 700 nm in which visible light is included was low.

TABLE 1

| Examples | Minimum value of reflectance (%) | | Difference of the reflectance minimum values |
|---|---|---|---|
| | 700-850 nm R1 | 300-700 nm R2 | R1 − R2 (%) |
| Example 1 | 92.8 | 54.1 | 38.7 |
| Example 2 | 87.0 | 42.6 | 44.4 |
| Example 3 | 98.6 | 58.9 | 39.8 |
| Example 4 | 99.1 | 74.6 | 24.5 |
| Example 5 | 96.5 | 62.8 | 33.8 |
| Example 6 | 94.3 | 49.2 | 45.2 |
| Example 7 | 91.7 | 56.0 | 35.7 |
| Example 8 | 92.1 | 60.1 | 32.0 |
| Example 9 | 89.6 | 48.2 | 41.4 |
| Example 10 | 89.8 | 54.1 | 35.7 |

Example 13

Commercially available $CaCO_3$ powder (5122136 manufactured by Hakushin Chemical Laboratory Co., Ltd.), $La(OH)_3$ powder (4510551 manufactured by Kojundo Chemical Laboratory Co., Ltd.), MgO powder (LKG5947 manufactured by Wako Pure Chemical Industries, Ltd.), $Al_2O_3$ powder (AKP-20 manufactured by Sumitomo Chemical Co., Ltd.), and $Cr_2O_3$ powder (60211K2 manufactured by Furuuchi Chemical Corporation) were weighed in such a manner that a phosphor obtained after synthesis was $La_{0.5}Ca_{0.5}Mg_{0.5}Al_{11.38}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 13 was obtained.

Figure 27:
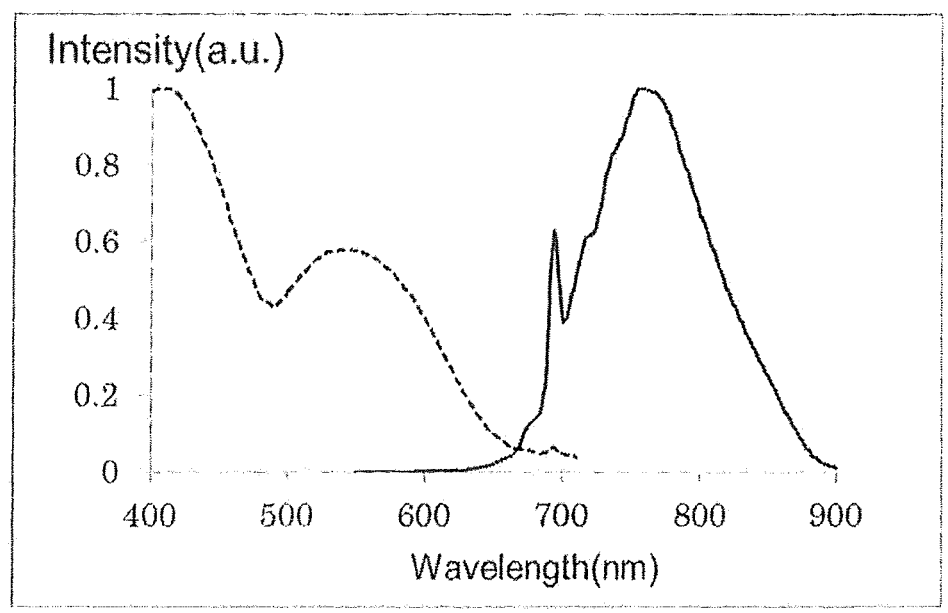
FIG. 27 shows excitation and emission spectra of a phosphor of Example 13.

The excitation and emission spectra of the phosphor of Example 13 are shown in FIG. 27. The emission peak wavelength of the phosphor of Example 13 was 755 nm, and the half width of the emission peak wavelength was 107 nm. In FIG. 27, the solid line shows the emission spectrum when irradiated with excitation light of wavelength 455 nm, and the dotted line shows the excitation spectrum for the emission peak wavelength of 755 nm. From the above, it can be seen that the phosphor can be excited over a wide range of visible light.

Figure 28:
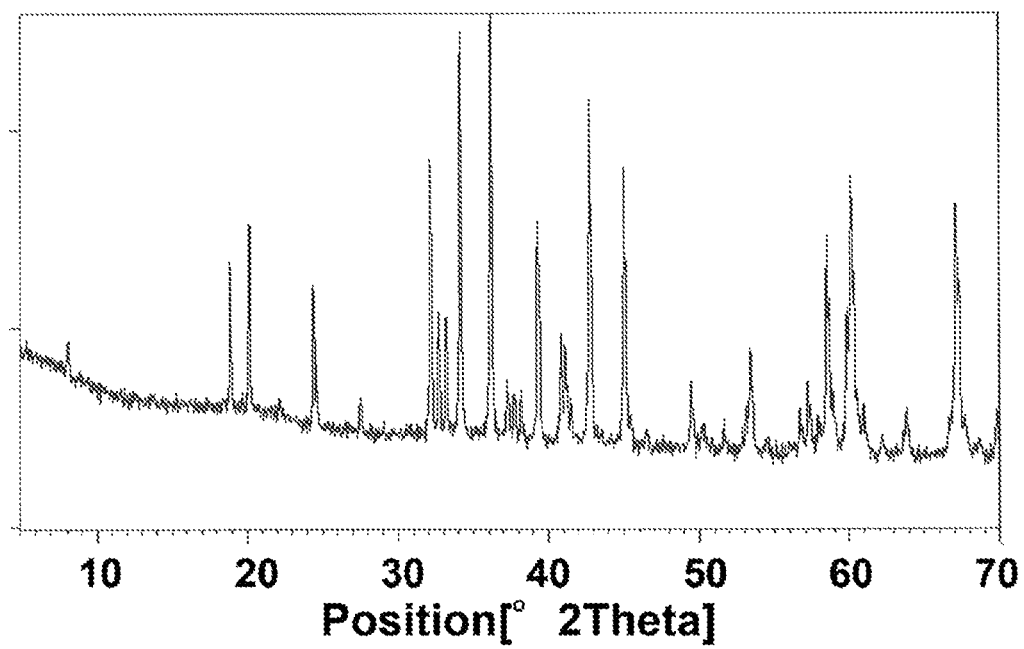
FIG. 28 shows an XRD pattern of a phosphor of Example 13.

An XRD pattern obtained by performing powder X-ray diffraction measurement on the phosphor of Example 13 is shown in FIG. 28.

Example 14

Commercially available $CaCO_3$ powder (5122136 manufactured by Hakushin Chemical Laboratory Co., Ltd.), $La(OH)_3$ powder (4510551 manufactured by Kojundo Chemical Laboratory Co., Ltd.), $Tm_2O_3$ powder (TM-04-001 manufactured by Shin-Etsu Chemical Co., Ltd.), MgO powder (LKG5947 manufactured by Wako Pure Chemical Industries, Ltd.), $Al_2O_3$ powder (AKP-20 manufactured by Sumitomo Chemical Co., Ltd.), and $Cr_2O_3$ powder (60211K2 manufactured by Furuuchi Chemical Corporation) were weighed in such a manner that a phosphor obtained after synthesis was $La_{0.49}Tm_{0.01}Ca_{0.5}Mg_{0.5}Al_{11.38}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 14 was obtained.

Figure 29:
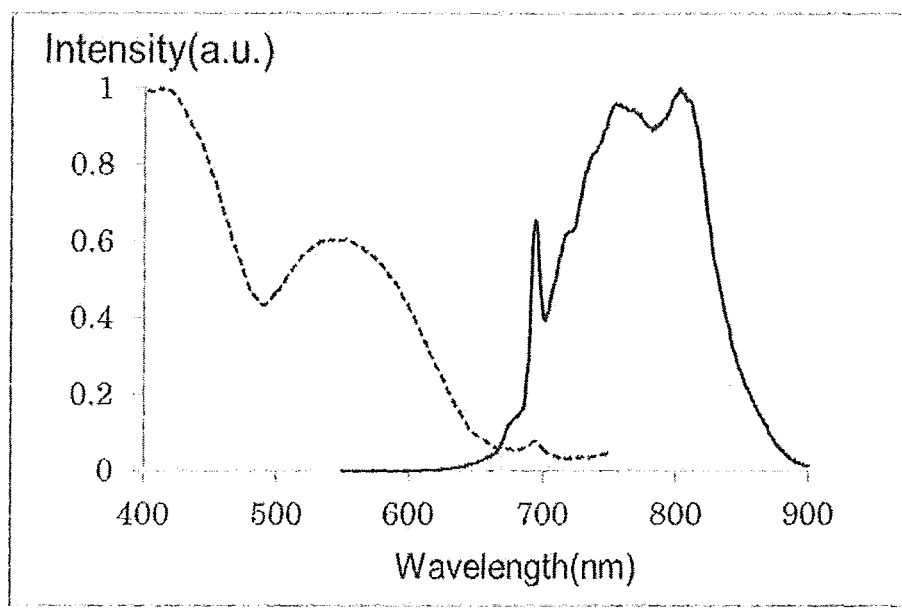
FIG. 29 shows excitation and emission spectra of a phosphor of Example 14.

The excitation and emission spectra of the phosphor of Example 14 are shown in FIG. 29. The emission peak wavelength of the phosphor of Example 14 was 803 nm, and the half width of the emission peak wavelength was 121 nm. In FIG. 29, the solid line shows the emission spectrum when irradiated with excitation light of wavelength 455 nm, and the dotted line shows the excitation spectrum for the emission peak wavelength of 803 nm. From the above, it can be seen that the phosphor can be excited over a wide range of visible light.

Figure 30:
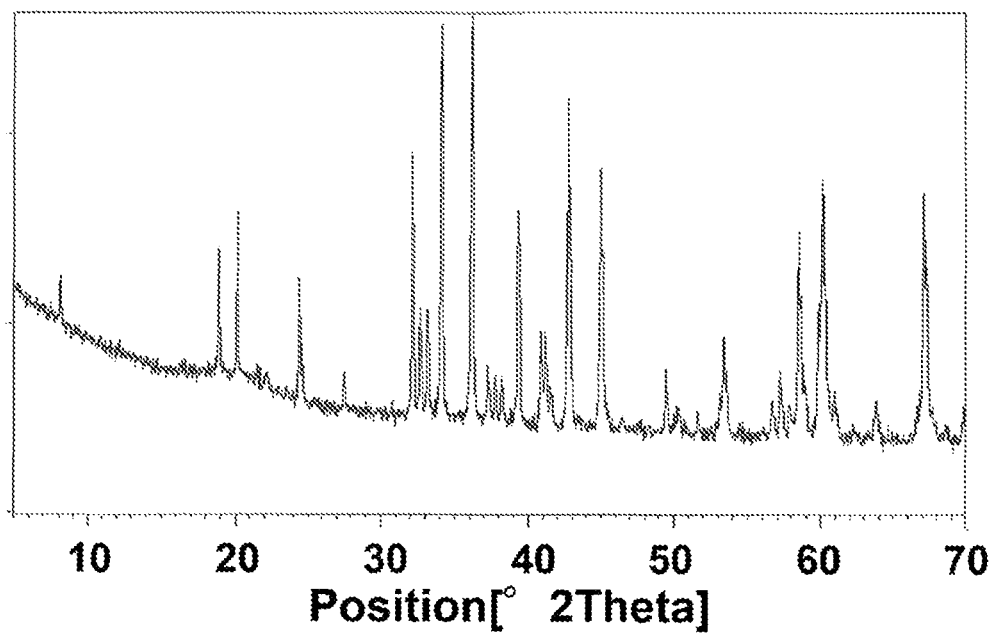
FIG. 30 shows an XRD pattern of a phosphor of Example 14.

An XRD pattern obtained by performing powder X-ray diffraction measurement on the phosphor of Example 14 is shown in FIG. 30.

Example 15

Commercially available $SrCO_3$ powder (506149 manufactured by Hakushin Chemical Laboratory Co., Ltd.), $La(OH)_3$ powder (4510551 manufactured by Kojundo Chemical Laboratory Co., Ltd.), MgO powder (LKG5947 manufactured by Wako Pure Chemical Industries, Ltd.), $Al_2O_3$ powder (AKP-20 manufactured by Sumitomo Chemical Co., Ltd.), and $Cr_2O_3$ powder (60211K2 manufactured by Furuuchi Chemical Corporation) were weighed in such a manner that a phosphor obtained after synthesis was $La_{0.5}Sr_{0.5}Mg_{0.5}Al_{11.38}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 15 was obtained.

Figure 31:
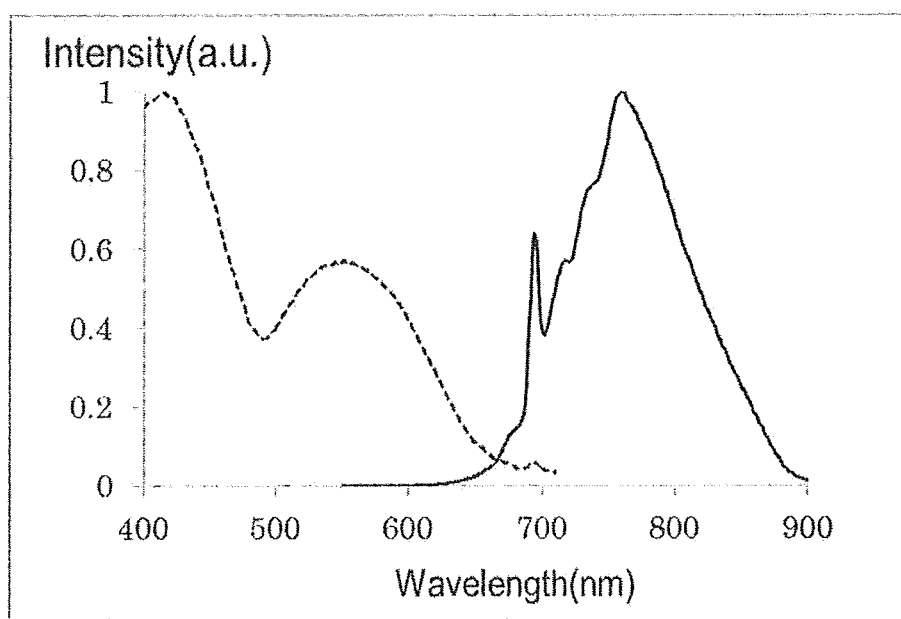
FIG. 31 shows excitation and emission spectra of a phosphor of Example 15.

The excitation and emission spectra of the phosphor of Example 15 are shown in FIG. 31. The emission peak wavelength of the phosphor of Example 15 was 760 nm, and the half width of the emission peak wavelength was 108 nm. In FIG. 31, the solid line shows the emission spectrum when irradiated with excitation light of wavelength 455 nm, and the dotted line shows the excitation spectrum for the emission peak wavelength of 760 nm. From the above, it can be seen that the phosphor can be excited over a wide range of visible light.

Figure 32:
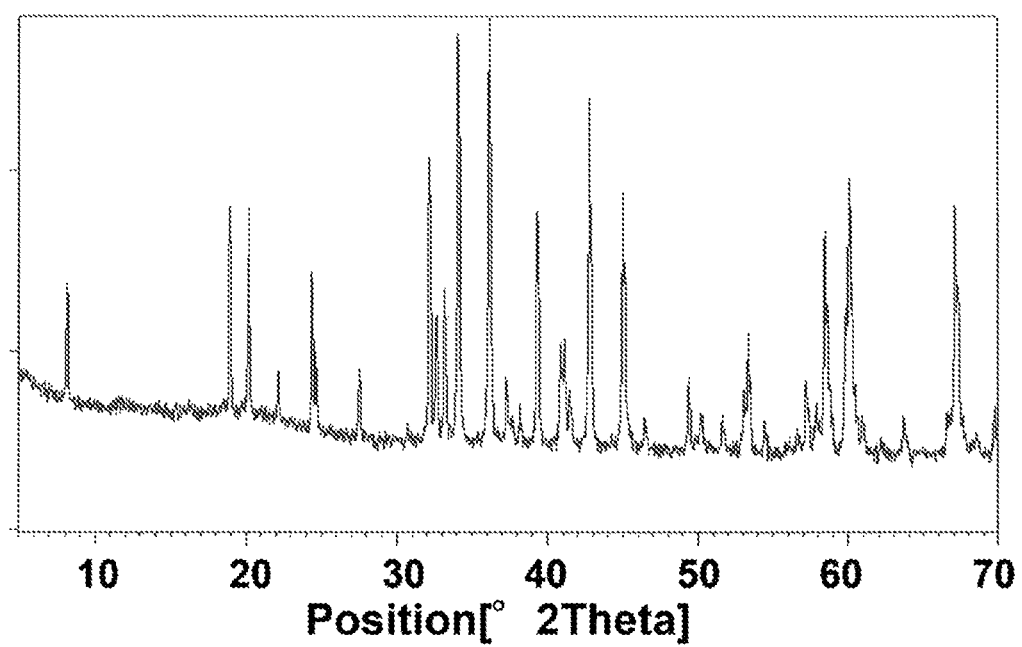
FIG. 32 shows an XRD pattern of a phosphor of Example 15.

An XRD pattern obtained by performing powder X-ray diffraction measurement on the phosphor of Example 15 is shown in FIG. 32.

Example 16

Commercially available $SrCO_3$ powder (506149 manufactured by Hakushin Chemical Laboratory Co., Ltd.), $La(OH)_3$ powder (4510551 manufactured by Kojundo Chemical Laboratory Co., Ltd.), $Tm_2O_3$ powder (TM-04-001 manufactured by Shin-Etsu Chemical Co., Ltd.), MgO powder (LKG5947 manufactured by Wako Pure Chemical Industries, Ltd.), $Al_2O_3$ powder (AKP-20 manufactured by Sumitomo Chemical Co., Ltd.), and $Cr_2O_3$ powder (60211K2 manufactured by Furuuchi Chemical Corporation) were weighed in such a manner that a phosphor obtained after synthesis was $La_{0.49}Tm_{0.01}Sr_{0.5}Mg_{0.5}Al_{11.38}Cr_{0.12}O_{19}$, and in order to promote crystal growth, 5% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,500° C. in the atmosphere for 8 hours, and a fired body was obtained. The fired body was crushed in an alumina mortar until there were no large lumps, and a phosphor of Example 16 was obtained.

Figure 33:
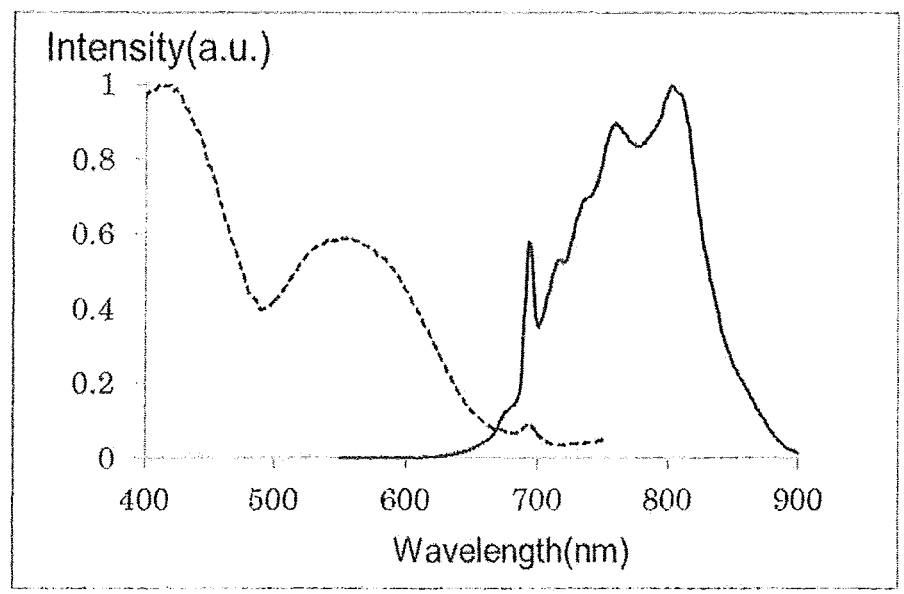
FIG. 33 shows excitation and emission spectra of a phosphor of Example 16.

The excitation and emission spectra of the phosphor of Example 16 are shown in FIG. 33. The emission peak wavelength of the phosphor of Example 16 was 803 nm, and the half width of the emission peak wavelength was 119 nm. In FIG. 33, the solid line shows the emission spectrum when irradiated with excitation light of wavelength 455 nm, and the dotted line shows the excitation spectrum for the emission peak wavelength of 803 nm. From the above, it can be seen that the phosphor can be excited over a wide range of visible light.

Figure 34:
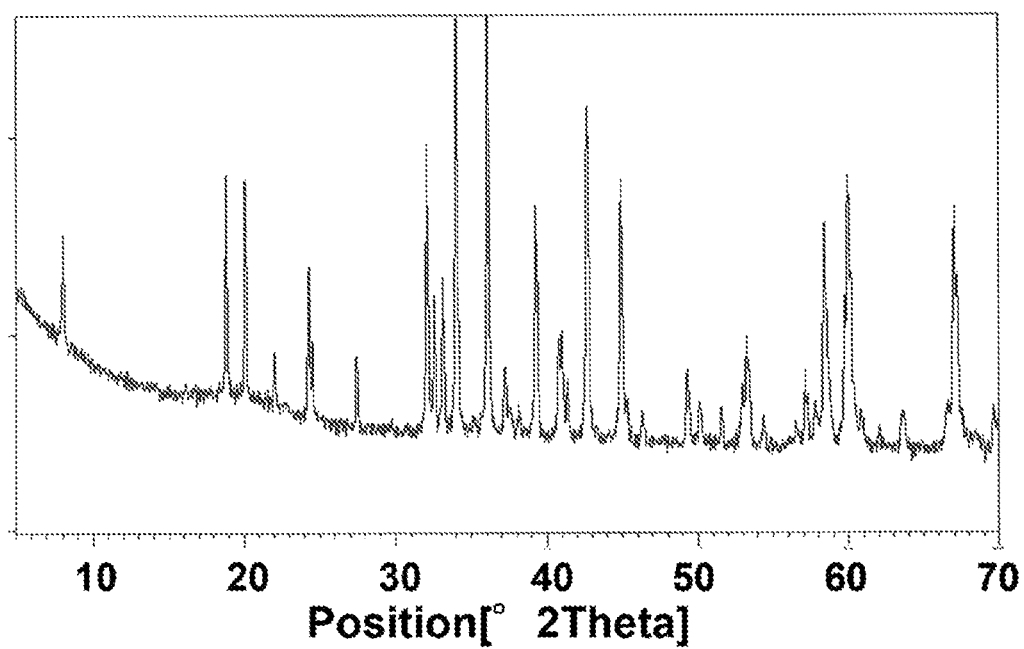
FIG. 34 shows an XRD pattern of a phosphor of Example 16.

An XRD pattern obtained by performing powder X-ray diffraction measurement on the phosphor of Example 16 is shown in FIG. 34.

Example 17

As raw materials, commercially available $BaCO_3$ powder (168713 manufactured by Kojundo Chemical Laboratory Co., Ltd.), $SrCO_3$ powder (20820-61H-S manufactured by RARE METALLIC Co., Ltd.), MgO powder (LKG5947 Wako Pure Chemical Industries, Ltd.), $Al_2O_3$ powder (AKP-20 manufactured by Sumitomo Chemical Co., Ltd.), and $Sm_2O_3$ powder (44208 manufactured by Mitsuwa Chemicals Co., Ltd.) were weighed in such a manner that a phosphor obtained after synthesis was $Ba_{0.4}Sr_{0.5}Sm_{0.1}MgAl_{10}O_{17}$, and in order to promote crystal growth, 1% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,600° C. in the atmosphere for 8 hours, and a fired body was obtained. The fired body was crushed in an alumina mortar until there were no large lumps, the resultant was placed in an alumina container, and then placed in a tubular furnace, and heated at 1,500° C. for 4 h while flowing nitrogen $N_2$ gas in the presence of carbon, and a fired body was obtained. The fired body was crushed in an alumina mortar until there were no large lumps, and a phosphor of Example 17 was obtained.

Figure 35:
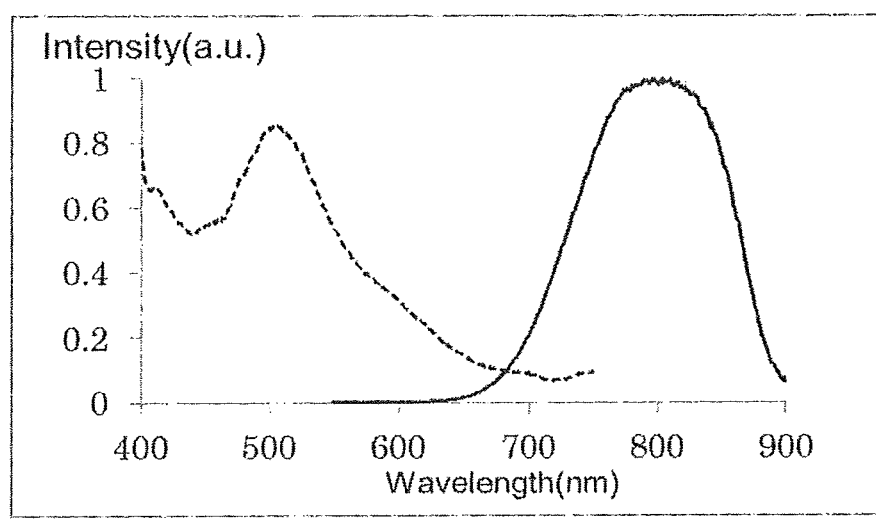
FIG. 35 shows excitation and emission spectra of a phosphor of Example 17.

The excitation and emission spectra of the phosphor of Example 17 are shown in FIG. 35. The emission peak wavelength of the phosphor of Example 17 was 804 nm, and the half width of the emission peak wavelength was 137 nm. In FIG. 35, the solid line shows the emission spectrum when irradiated with excitation light of wavelength 455 nm, and the dotted line shows the excitation spectrum for the emission peak wavelength of 804 nm. From the above, it can be seen that the phosphor can be excited over a wide range of visible light.

Figure 36:
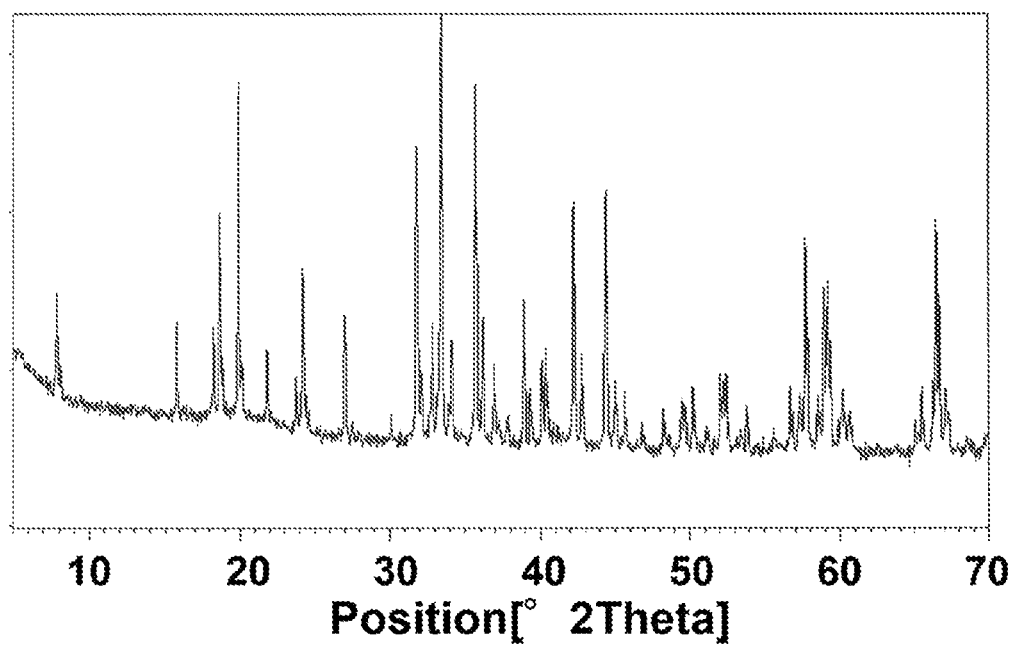
FIG. 36 shows an XRD pattern of a phosphor of Example 17.

An XRD pattern obtained by performing powder X-ray diffraction measurement on the phosphor of Example 17 is shown in FIG. 36. It can be seen that the phosphor of Example 17 is composed of $(Ba, Sr)MgAl_{10}O_{17}$ as a main phase.

Example 18

As raw materials, commercially available $CaCO_3$ powder (8071073 manufactured by Hakushin Chemical Laboratory Co., Ltd.), $Sc_2O_3$ powder (RSC-04-2801 manufactured by Shin-Etsu Chemical Co., Ltd.), and $Eu_2O_3$ powder (21211-13 manufactured by RARE METALLIC Co., Ltd.) were weighed in such a manner that a phosphor obtained after synthesis was $Ca_{0.995}Eu_{0.005}Sc_2O_4$.

Figure 37:
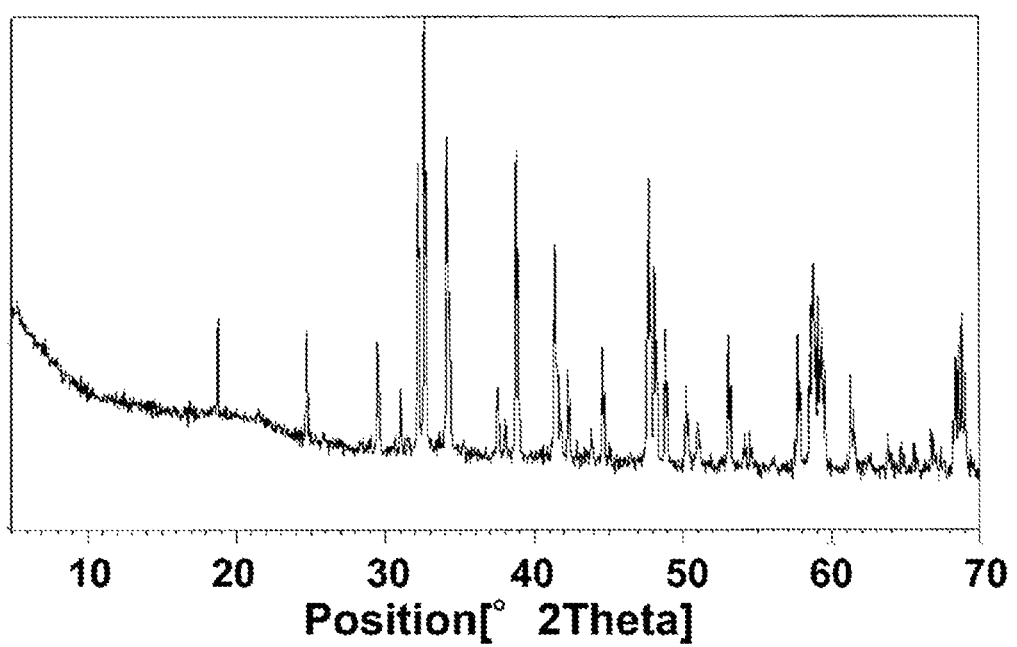
FIG. 37 shows an XRD pattern of a phosphor of Example 18.

The raw materials were mixed with ethanol in an alumina mortar and then wet mixed, the ethanol was naturally dried, the mixture was put into an alumina container, the container containing the mixed raw materials was placed in a tubular furnace, and heated at 1,450° C. for 8 hours while flowing a mixed gas of $N_2$ and $H_2$ (4% of $H_2$), and a fired body was obtained. The fired body was crushed in an alumina mortar until there were no large lumps, powder X-ray diffraction measurement was performed, and an XRD pattern was obtained, which is shown in FIG. 37. It can be seen that the fired body is composed of $CaSc_2O_4$ as a main phase. The powder obtained by crushing was placed in a BN container, and then placed in a tubular furnace, and heated at 1, 500° C. for 4 hours while flowing nitrogen $N_2$ gas in the presence of carbon, and a fired body was obtained. The fired body was crushed in an alumina mortar until there were no large lumps, and a phosphor of Example 18 was obtained.

Figure 38:
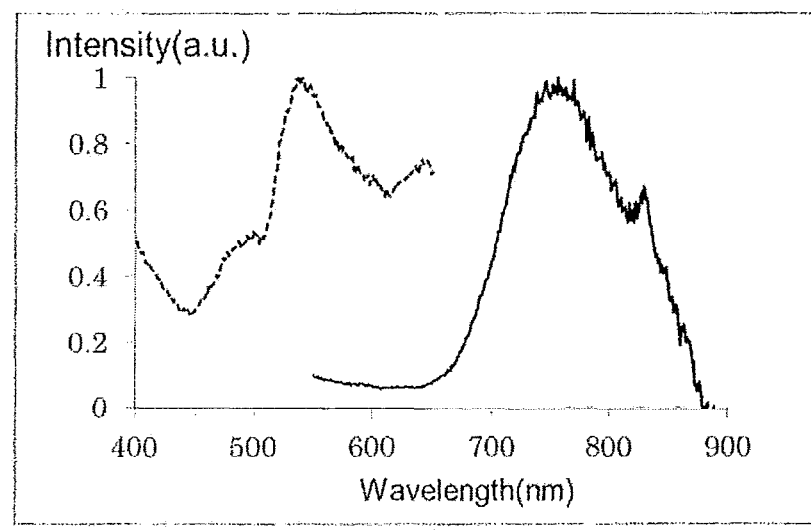
FIG. 38 shows excitation and emission spectra of a phosphor of Example 18.

The excitation and emission spectra of the phosphor of Example 18 are shown in FIG. 38. The emission peak wavelength of the phosphor of Example 18 was 756 nm, and the half width of the emission peak wavelength was 132 nm. In FIG. 38, the solid line shows the emission spectrum when irradiated with excitation light of wavelength 455 nm, and the dotted line shows the excitation spectrum for the emission peak wavelength of 756 nm. From the above, it can be seen that the phosphor can be excited over a wide range of visible light.

Example 19

As raw materials, commercially available $La(OH)_3$ powder (4401411 manufactured by Kojundo Chemical Laboratory Co., Ltd.), $Al_2O_3$ powder (AKP-20 manufactured by Sumitomo Chemical Co., Ltd.), $Ga_2O_3$ powder (90402 manufactured by MITSUI MINING & SMELTING CO., LTD.), $GeO_2$ (313826 manufactured by Kojundo Chemical Laboratory Co., Ltd.), and $Cr_2O_3$ powder (B58840N manufactured by KISHIDA CHEMICAL Co., Ltd.) were weighed in such a manner that a phosphor obtained after synthesis was $La_{3.0}Ga_{2.45}Al_{2.50}Cr_{0.05}GeO_{14}$, and in order to promote crystal growth, 1% by weight of $H_3BO_3$ (WAQ 3766 manufactured by Wako Pure Chemical Industries, Ltd.) was externally added thereto.

The raw materials were mixed with ethanol in an alumina mortar and then wet mixed, the ethanol was naturally dried, the mixture was put into an alumina container, the container containing the mixed raw materials was placed in a small electric furnace (Super Burn manufactured by Motoyama Co., Ltd.), and heated at 1,300° C. in the atmosphere for 8 hours, and a fired body was obtained. The fired body was crushed in an alumina mortar until there were no large lumps, and a phosphor of Example 19 was obtained.

Figure 39:
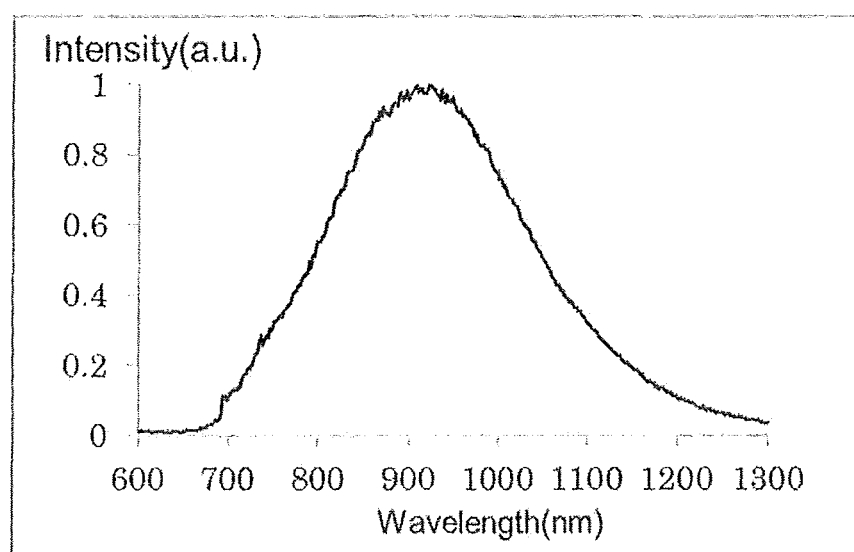
FIG. 39 shows an emission spectrum of a phosphor of Example 19.

The emission spectrum of the phosphor of Example 19 is shown in FIG. 39. The emission spectrum of Example 19 was measured by irradiating the phosphor with a semiconductor laser with an emission wavelength of 450 nm, and using a spectrometer and a near infrared photomultiplier tube (R5509-43 manufactured by Hamamatsu Photonics K.K.). The emission peak wavelength of the phosphor of Example 19 was 922 nm, and the half width of the emission peak wavelength was 256 nm.

Figure 40:
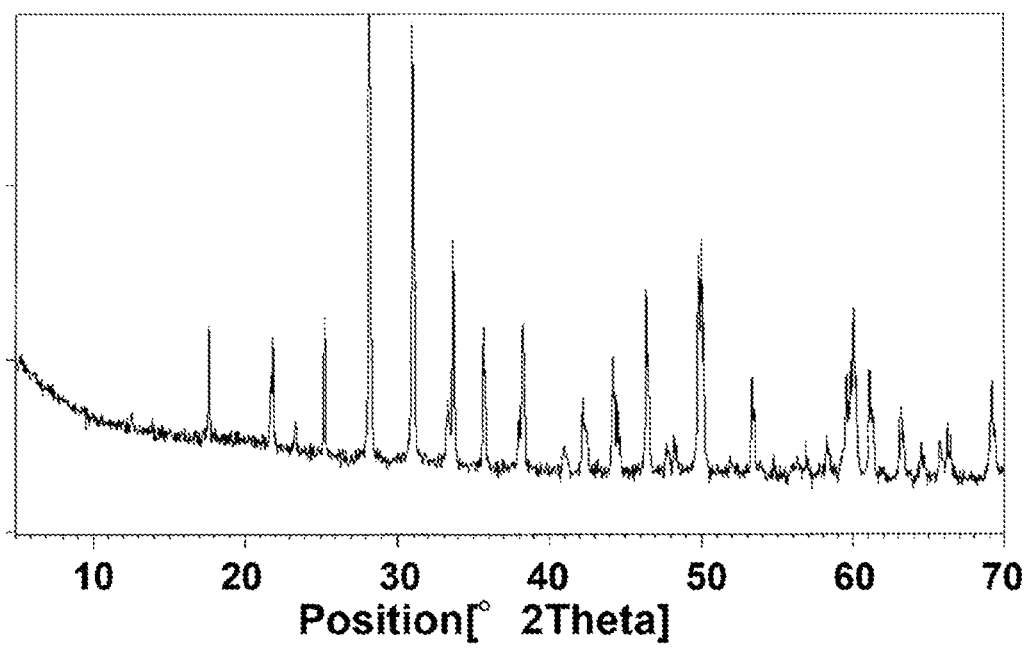
FIG. 40 shows an XRD pattern of a phosphor of Example 19.

An XRD pattern obtained by performing powder X-ray diffraction measurement on the phosphor of Example 19 is shown in FIG. 40. It can be seen that the phosphor of Example 19 is composed of $La_3(Al,Ga)_5GeO_{14}$.

Example 20

As raw materials, commercially available $La(OH)_3$ powder (4401411 manufactured by Kojundo Chemical Laboratory Co., Ltd.), $Sc_2O_3$ powder (RSC-04-2801 manufactured by Shin-Etsu Chemical Co., Ltd.), $Cr_2O_3$ powder (B58840N manufactured by KISHIDA CHEMICAL Co., Ltd.), and $H_3BO_3$ (WAQ3766 manufactured by Wako Pure Chemical Industries, Ltd.) were weighed in such a manner that there was a 5% excess of $H_3BO_3$ in order to compensate for $B_2O_3$ to be reduced by evaporation during firing, and that a phosphor obtained after synthesis was $LaSc_{2.91}Cr_{0.09}B_4O_{12}$.

The raw materials were dry mixed in an alumina mortar and placed in platinum foil, the platinum foil containing the mixed raw materials was placed in a small electric furnace (Super Burn manufactured by Motoyama Co., Ltd.), and heated at 1,300° C. in the atmosphere for 12 hours, and a fired body was obtained. The fired body was crushed in an alumina mortar until there were no large lumps, and a phosphor of Example 20 was obtained.

Figure 41:
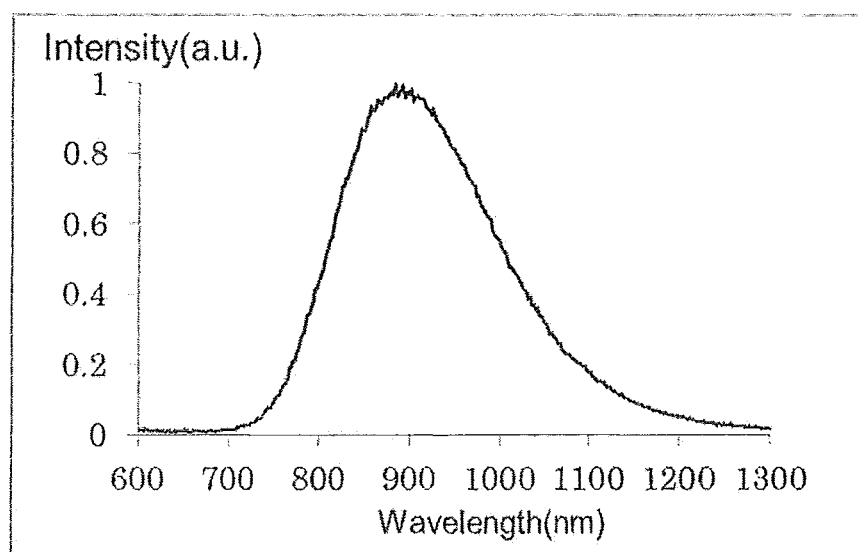
FIG. 41 shows an emission spectrum of a phosphor of Example 20.

The emission spectrum of the phosphor of Example 20 is shown in FIG. 41. The emission spectrum of Example 20 was measured by irradiating the phosphor with a semiconductor laser with an emission wavelength of 450 nm, and using a spectrometer and a near infrared photomultiplier tube (R5509-43 manufactured by Hamamatsu Photonics K.K.). The emission peak wavelength of the phosphor of Example 20 was 884 nm, and the half width of the emission peak wavelength was 202 nm.

Figure 42:
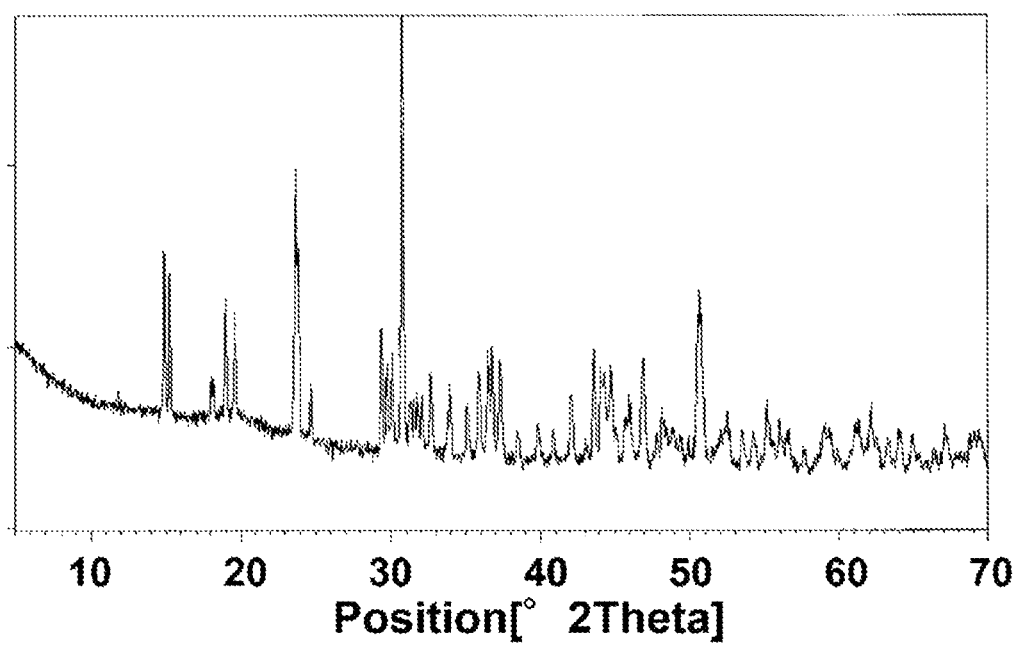
FIG. 42 shows an XRD pattern of a phosphor of Example 20.

An XRD pattern obtained by performing powder X-ray diffraction measurement on the phosphor of Example 20 is shown in FIG. 42. It can be seen that the phosphor of Example 20 is composed of single phase $LaSc_3B_4O_{12}$.

{Manufacture of Light-Emitting Device}

Example 21

An infrared light-emitting device was produced by combining the phosphor of Example 2 and a blue LED.

As raw materials, the phosphor obtained in Example 2 and a thermosetting silicone resin were used. The raw materials were weighed in such a manner to have a weight ratio of phosphor:thermosetting silicone resin=15:85. These raw materials were mixed using V-mini 300 manufactured by EME Corporation, the mixture was applied to a package on which a commercially available blue LED (manufactured by Showa Denko K.K.) was mounted, and cured, and a light-emitting device was obtained.

Figure 43:
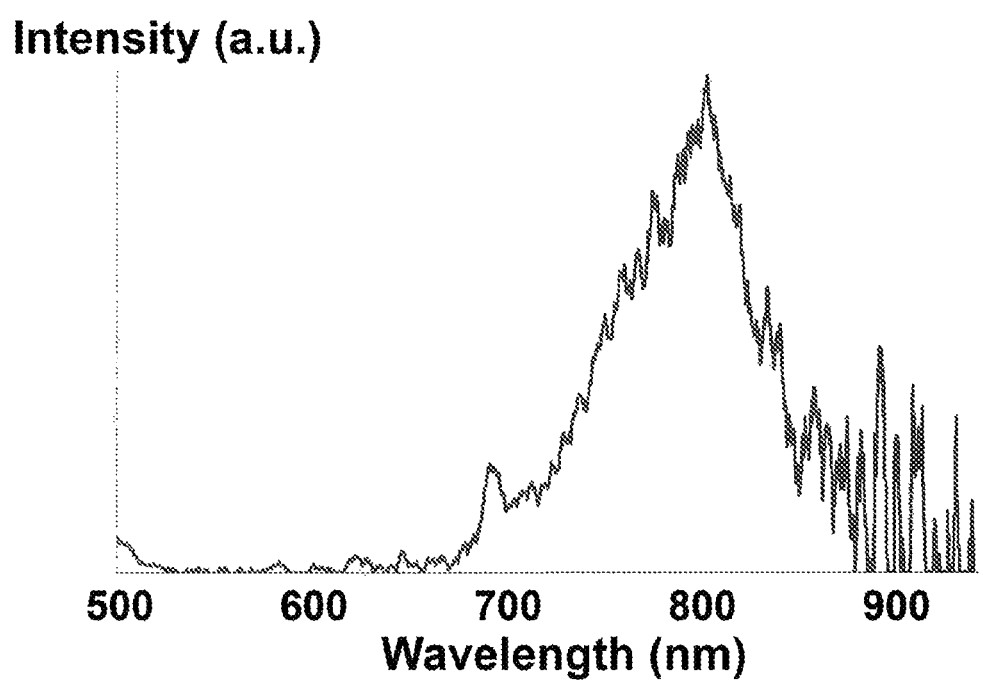
FIG. 43 shows an emission spectrum of a light-emitting device of Example 21.

The emission spectrum of the light-emitting device is shown in FIG. 43. It can be seen that the light-emitting device has an infrared emission peak at about 800 nm and exhibits a wide range of infrared emission.

The invention claimed is:

1. A light-emitting device comprising:
a semiconductor light-emitting element that emits ultraviolet light or visible light; and
a phosphor that absorbs ultraviolet light or visible light emitted from the semiconductor light-emitting element and emits light in the infrared region,
wherein an emission peak wavelength in the infrared region of the phosphor emitting in the infrared region is from 780 to 1,050 nm, and the half width of an emission peak waveform is more than 50 nm, and
wherein the phosphor that emits light in the infrared region is represented by the following Formula (1)

where
M1 represents one or more metal elements selected from alkaline earth metal elements other than Mg;
M2 represents one or more metal elements selected from rare earth metal elements other than Sc;
M3 represents two or more metal elements comprising at least Ga and Al, and comprising one or more metal elements selected from Mg, Zn, B, In, Sc, Si, Ge, Ti, Sn, Zr, and Hf;

M4 represents one or more metal elements selected from Cr, Mn, Fe, Ni, and Cu;
O represents oxygen; and
0≤b≤1 and 0<d≤0.5.

2. The light-emitting device according to claim 1, wherein the phosphor that emits light in the infrared region consists of a phosphor having an afterglow time which is the time taken for the emission peak intensity to fall to ⅒ of the initial emission peak intensity of 10 ms or less.

3. The light-emitting device according to claim 1, wherein the phosphor that emits light in the infrared region consists of a phosphor having a reflectance at a wavelength from 700 to 850 nm of 80% or more.

4. The light-emitting device according to claim 3, wherein the phosphor that emits light in the infrared region has a reflectance at a wavelength from 700 to 850 nm higher than a reflectance at a wavelength from 300 to 700 nm by 20% or more.

5. The light-emitting device according to claim 1, wherein the phosphor that emits light in the infrared region comprises at least Cr as an activator element.

6. The light-emitting device according to claim 1, wherein the phosphor that emits light in the infrared region comprises at least $Eu^{2+}$ or $Sm^{2+}$ as an activator element.

7. The light-emitting device according to claim 1, wherein the phosphor that emits light in the infrared region has a magnet plumbite structure as a crystal phase.

8. A light-emitting device comprising:
a semiconductor light-emitting element that emits ultraviolet light or visible light; and
a phosphor that absorbs ultraviolet light or visible light emitted from the semiconductor light-emitting element and emits light in the infrared region,
wherein the half width of an emission peak waveform of the phosphor is more than 50 um; and
wherein the phosphor emitting in the infrared region comprises a crystal phase of a chemical composition represented by the following Formula (2) and having an emission peak wavelength in a wavelength range of 750 um to 1,050 nm;

where
A1 represents one or more metal elements selected from alkaline earth metal elements other than Mg;
A2 represents one or more metal elements selected from rare earth metal elements other than Sc;
A3 represents one or more metal elements comprising at least Al;
A4 represents one or more metal elements selected from Cr, Mn, Fe, Ni, and Cu;
O represents oxygen; and
0≤a≤1 and 0<c≤0.5.

9. The light-emitting device according to claim 8, wherein the metal element A3 in the Formula (2) further comprises one or more metal elements selected from Mg, Zn, B, Ga, La, Se, Si, Ge, Zr, and Hf.

10. The light-emitting device according to claim 8, wherein the metal element A3 in the Formula (2) comprises Al and Ga.

11. The light-emitting device according to claim 8, wherein 0<a≤1 in the Formula (2).

12. The light-emitting device according to claim 8, wherein the metal element A2 in the Formula (2) comprises at least Tm.

13. The light-emitting device according to claim 8, wherein the metal element A1 in the Formula (2) comprises at least Ca or Sr.

14. The light-emitting device according to claim 8, wherein the metal element A4 in the Formula (2) comprises at least Cr.

15. The light-emitting device according to claim 8, wherein the phosphor has an afterglow time which is the time taken for the emission peak intensity to fall to 1/10 of the initial emission peak intensity of 10 ms or less.

16. An image recognition apparatus comprising:
a semiconductor light-receiving element having a spectral sensitivity at a wavelength range of 750 to 1,050 nm; and
the light-emitting device according to claim 1.

17. An image recognition apparatus comprising:
a semiconductor light-receiving element having a spectral sensitivity at a wavelength range of 750 to 1,050 nm; and
the light-emitting device according to claim 8.

18. An analysis apparatus analyzing blood and/or food and comprising:
a semiconductor light-receiving element having a spectral sensitivity at a wavelength range of 750 to 1,050 nm; and
the light-emitting device according to claim 1.

19. An analysis apparatus analyzing blood and/or food and comprising:
a semiconductor light-receiving element having a spectral sensitivity at a wavelength range of 750 to 1,050 nm; and
the light-emitting device according to claim 8.

* * * * *

UNITED STATES PATENT AND TRADEMARK OFFICE
CERTIFICATE OF CORRECTION

PATENT NO. : 11,560,516 B2
APPLICATION NO. : 16/590604
DATED : January 24, 2023
INVENTOR(S) : Byungchul Hong It is certified that error appears in the above-identified patent and that said Letters Patent is hereby corrected as shown below:

In the Claims

In Column 33, Claim 1, Lines 63, delete "Se" and insert -- Sc --.

In Column 34, Claim 8, Lines 37, delete "50 um" and insert -- 50 nm --.

In Column 34, Claim 8, Lines 42, delete "750 um" and insert -- 750 nm --.

In Column 34, Claim 8, Lines 46, delete "Al" and insert -- A1 --.

In Column 34, Claim 9, Lines 59, delete "La, Se, Si, Ge," and insert -- In, Sc, Si, Ge, Ti, Sn, --.

In Column 35, Claim 13, Lines 2, delete "Al" and insert -- A1 --.

Signed and Sealed this
Fourth Day of July, 2023

Katherine Kelly Vidal
*Director of the United States Patent and Trademark Office*